United States Patent
Imai et al.

(10) Patent No.: US 12,142,614 B2
(45) Date of Patent: Nov. 12, 2024

(54) ACTIVE MATRIX SUBSTRATE

(71) Applicant: Sharp Kabushiki Kaisha, Osaka (JP)

(72) Inventors: Hajime Imai, Sakai (JP); Tohru Daitoh, Sakai (JP); Teruyuki Ueda, Sakai (JP); Yoshihito Hara, Sakai (JP); Masaki Maeda, Sakai (JP); Tatsuya Kawasaki, Sakai (JP); Yoshiharu Hirata, Sakai (JP); Tetsuo Kikuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/199,142

(22) Filed: May 18, 2023

(65) Prior Publication Data

US 2023/0307465 A1 Sep. 28, 2023

Related U.S. Application Data

(63) Continuation of application No. 17/118,666, filed on Dec. 11, 2020, now Pat. No. 11,695,020.

(30) Foreign Application Priority Data

Dec. 17, 2019 (JP) .................. 2019-227122

(51) Int. Cl.
*H01L 27/12* (2006.01)
(52) U.S. Cl.
CPC ........ *H01L 27/124* (2013.01); *H01L 27/1225* (2013.01); *H01L 27/127* (2013.01)
(58) Field of Classification Search
CPC ... H01L 27/124; H01L 27/12; H01L 27/1225; H01L 27/127; H01L 27/1248;
(Continued)

(56) References Cited

U.S. PATENT DOCUMENTS 9,847,864 B2 * 12/2017 Lunttila ............... H04L 5/0091
2004/0051822 A1   3/2004 Sato
(Continued)

FOREIGN PATENT DOCUMENTS

JP   2001-117115 A   4/2001
JP   2004-054033 A   2/2004
(Continued)

OTHER PUBLICATIONS

Imai et al., "Active Matrix Substrate and Method for Manufacturing Same", U.S. Appl. No. 17/118,666, filed Dec. 11, 2020.

*Primary Examiner* — Nikolay K Yushin
(74) *Attorney, Agent, or Firm* — Keating & Bennett, LLP

(57) ABSTRACT

An active matrix substrate includes a plurality of source bus lines, a lower insulating layer covering the source bus lines, a plurality of gate bus lines formed above the lower insulating layer, and an oxide semiconductor TFT disposed to correspond to each pixel area. The oxide semiconductor TFT includes an oxide semiconductor layer disposed on the lower insulating layer, and a gate electrode disposed above the oxide semiconductor layer. The gate electrode is formed in a different layer from the gate bus lines, and is disposed to be separated from another gate electrode disposed in an adjacent pixel area. The gate electrode is covered by an interlayer insulating layer. The gate bus line is disposed on the interlayer insulating layer and in a gate contact hole formed in the interlayer insulating layer, and is connected to the gate electrode in the gate contact hole.

8 Claims, 56 Drawing Sheets

(58) Field of Classification Search
CPC ............... H01L 27/1259; G02F 1/1362; G02F 1/136204; G02F 1/1368; G02F 1/134336; G02F 1/134363
See application file for complete search history.

(56) References Cited

U.S. PATENT DOCUMENTS

| | | |
|---|---|---|
| 2011/0062436 A1 | 3/2011 | Yamazaki et al. |
| 2016/0093647 A1* | 3/2016 | Kim .................... H01L 27/1255 257/40 |
| 2017/0090229 A1* | 3/2017 | Imai .................. H01L 29/78633 |
| 2018/0083076 A1 | 3/2018 | Hanada |
| 2019/0331972 A1 | 10/2019 | Nimura et al. |

FOREIGN PATENT DOCUMENTS

| | | |
|---|---|---|
| JP | 2010-287628 A | 12/2010 |
| JP | 2011-086923 A | 4/2011 |
| JP | 2018-049919 A | 3/2018 |
| JP | 2019-191354 A | 10/2019 |

* cited by examiner

ACTIVE MATRIX SUBSTRATE

CROSS-REFERENCE TO RELATED APPLICATIONS

This application claims the benefit of priority to Japanese Patent Application Number 2019-227122 filed on Dec. 17, 2019. The entire contents of the above-identified application are hereby incorporated by reference.

BACKGROUND

Technical Field

The disclosure relates to an active matrix substrate and a manufacturing method of the active matrix substrate.

A display device has been widely used that includes an active matrix substrate provided with switching elements for respective pixels. An active matrix substrate provided with thin film transistors (hereinafter referred to as a "TFT") as the switching elements is referred to as a TFT substrate. Note that, a portion of the TFT substrate corresponding to a pixel of the display device is referred to herein as a pixel area or a pixel. The TFT provided as the switching element to each pixel of the active matrix substrate is referred to as a "pixel TFT". The TFT substrate is provided with a plurality of source bus lines and a plurality of gate bus lines, and a pixel TFT is disposed in the vicinity of each of intersections of these lines. A source electrode of the pixel TFT is connected to one of the source bus lines, and a gate electrode is connected to one of the gate bus lines.

In recent years, use of an oxide semiconductor as a material of an active layer of the TFT, in place of amorphous silicon and polycrystalline silicon has been proposed. Such a TFT is referred to as an "oxide semiconductor TFT." The oxide semiconductor has mobility higher than that of amorphous silicon. Thus, the oxide semiconductor TFT can operate at a higher speed than an amorphous silicon TFT. In addition, since an oxide semiconductor film is formed by a process simpler than that of a polycrystalline silicon film, the oxide semiconductor film can be applied to a device that requires a large area.

While many oxide semiconductor TFTs are bottom gate structure TFTs, top gate structure oxide semiconductor TFTs have been proposed as well.

JP 2015-109315 A discloses a top gate TFT in which a gate electrode is disposed on a part of an oxide semiconductor layer with a gate insulating layer being interposed therebetween, and source and drain electrodes are disposed on an insulating layer covering the gate electrode.

On the other hand, WO 2015/186619 A filed by the same applicant as the present application proposes a substrate structure (hereinafter "bottom source wiring line structure"), in which a source electrode and source bus lines are provided closer to a substrate side than the gate bus lines. In the structure, the source bus lines are disposed closer to the substrate side than the oxide semiconductor layer of an oxide semiconductor TFT, and the gate bus lines are disposed above the oxide semiconductor layer. According to a TFT substrate having the bottom source wiring line structure (the TFT substrate is hereinafter shortened as a "bottom source wiring line substrate"), the thickness of an insulating layer located between the source bus lines and the gate bus lines can be increased, and parasitic capacitance generated at intersections of these bus lines can thus be reduced.

SUMMARY

In a TFT substrate (for example, the bottom source wiring line substrate) using oxide semiconductor TFTs having the top gate structure as pixel TFTs, for example, each gate bus line is disposed above the oxide semiconductor layer of a corresponding oxide semiconductor TFT with a gate insulating layer being interposed therebetween, and extends across an edge portion of the oxide semiconductor layer of a plurality of pixel TFTs.

According to the examination carried out by the inventors of the disclosure, the following is discovered: When the configuration described above is employed, electric charge stored in the gate bus lines may cause Electro-Static Discharge (ESD) at edge portions of the oxide semiconductor layer that is located below the gate bus lines during a manufacture process of a TFT array. This may be a factor of occurrence of leakage between the source and the gate. The details thereof will be described later with reference to FIG. 16A to FIG. 16C.

One embodiment of the disclosure provides an active matrix substrate that includes an oxide semiconductor TFT having a top gate structure and that is capable of preventing leakage between a source and a gate due to ESD.

An active matrix substrate and a manufacturing method of an active matrix substrate are disclosed herein in the following items.

Item 1

An active matrix substrate including a plurality of pixel areas, the active matrix substrate including:
  a substrate;
  a plurality of source bus lines supported on a main surface of the substrate and extending in a first direction;
  a lower insulating layer covering the plurality of source bus lines;
  a plurality of gate bus lines formed above the lower insulating layer and extending in a second direction intersecting the first direction; and
  an oxide semiconductor TFT and a pixel electrode disposed to correspond to each of the plurality of pixel areas,
  wherein in each of the plurality of pixel areas,
  the oxide semiconductor TFT includes
  an oxide semiconductor layer disposed on the lower insulating layer, the oxide semiconductor layer including a channel region, a first region, and a second region, the first region and the second region being located on respective both sides of the channel region, the first region being electrically connected to a corresponding one of the plurality of source bus lines, the second region being electrically connected to the pixel electrode, and
  a gate electrode disposed on at least the channel region of the oxide semiconductor layer with a gate insulating layer being interposed between the gate electrode and the channel region, the gate electrode being formed in a different layer from the plurality of gate bus lines and being disposed to be separated from another gate electrode disposed in an adjacent one of the plurality of pixel areas,
  the oxide semiconductor layer and the gate electrode are covered by an interlayer insulating layer, and the interlayer insulating layer includes at least one gate contact hole for exposing a part of the gate electrode, and
  one of the plurality of gate bus lines is disposed on the interlayer insulating layer and in the at least one gate contact hole, and is electrically connected to the gate electrode in the at least one gate contact hole.

Item 2

The active matrix substrate according to item 1, wherein in each of the plurality of pixel areas, the oxide semiconductor TFT further includes a drain electrode connecting the second region of the oxide semiconductor layer and the pixel electrode, and the drain electrode is formed in a same layer as the plurality of gate bus lines.

Item 3

The active matrix substrate according to item 1 or 2, wherein in each of the plurality of pixel areas, when viewed from a normal direction of the main surface of the substrate, the gate electrode of the oxide semiconductor TFT includes a first part overlapping the oxide semiconductor layer and an extending part extending from the first part not to overlap the oxide semiconductor layer, and the at least one gate contact hole is disposed to expose a part of the extending part of the gate electrode.

Item 4

The active matrix substrate according to item 3, wherein when viewed from the normal direction of the main surface of the substrate, each of the plurality of pixel areas includes a source metal absent region in which neither an electrode nor a wiring line formed in a same layer as the plurality of source bus lines is present, and when viewed from the normal direction of the main surface of the substrate, the at least one gate contact hole is located in the source metal absent region.

Item 5

The active matrix substrate according to item 4, wherein in each of the plurality of pixel areas, when viewed from the normal direction of the main surface of the substrate, the at least one gate contact hole is disposed to cross an edge portion of the gate electrode.

Item 6

The active matrix substrate according to item 1 or 2, wherein in each of the plurality of pixel areas, when viewed from a normal direction of the main surface of the substrate, the at least one gate contact hole at least partially overlaps the channel region of the oxide semiconductor layer.

Item 7

The active matrix substrate according to any one of items 3 to 5, wherein in each of the plurality of pixel areas, the at least one gate contact hole includes a plurality of gate contact holes disposed to be spaced apart from each other.

Item 8

The active matrix substrate according to item 7, wherein in each of the plurality of pixel areas, when viewed from the normal direction of the main surface of the substrate, the extending part of the gate electrode includes a first extending part and a second extending part disposed on respective both sides of the first part, and the plurality of gate contact holes include a first gate contact hole disposed to overlap the first extending part and a second gate contact hole disposed to overlap the second extending part.

Item 9

The active matrix substrate according to any one of items 1 to 8, wherein in each of the plurality of pixel areas, the oxide semiconductor TFT further includes a source electrode being integrally formed by using a same conductive film as the corresponding one of the plurality of source bus lines, the lower insulating layer includes a source opening for exposing a part of the source electrode, and the first region of the oxide semiconductor layer is electrically connected to the part of the source electrode in the source opening.

Item 10

The active matrix substrate according to any one of items 1 to 8, wherein in each of the plurality of pixel areas, the oxide semiconductor TFT further includes a source electrode being integrally formed by using a same conductive film as the corresponding one of the plurality of source bus lines, a connection electrode formed in a same layer as the gate electrode, and a first insulating layer being disposed between the connection electrode and the lower insulating layer and being formed in a same layer as the gate insulating layer, the lower insulating layer includes a source opening for exposing a part of the source electrode, the first insulating layer includes a first opening for exposing a part of the first region of the oxide semiconductor layer, and at least partially overlapping the source opening when viewed from a normal direction of the main surface of the substrate, and the connection electrode is electrically connected to the part of the first region of the oxide semiconductor layer and the part of the source electrode in a source contact hole including the source opening of the lower insulating layer and the first opening of the first insulating layer.

Item 11

The active matrix substrate according to item 10, wherein in each of the plurality of pixel areas, the oxide semiconductor TFT further includes a lower conductive part being disposed between the oxide semiconductor layer and the substrate and being formed in a same layer as the plurality of source bus lines, the gate insulating layer and the lower insulating layer include a lower gate contact hole for exposing a part of the lower conductive part, and the gate electrode is electrically connected to the lower conductive part in the lower gate contact hole.

Item 12

The active matrix substrate according to item 10 or 11, wherein in each of the plurality of pixel areas, when viewed from the normal direction of the main surface of the substrate, the oxide semiconductor layer includes a second opening or a notched portion at least partially overlapping both of the source opening and the first opening, and the source contact hole further includes the second opening or the notched portion of the oxide semiconductor layer.

Item 13

The active matrix substrate according to any one of items 1 to 12, wherein in each of the plurality of pixel areas, when viewed from a normal direction of the main surface of the substrate, the gate electrode extends in the second direction to overlap a corresponding one of the plurality of gate bus lines.

Item 14

The active matrix substrate according to item 13, wherein in each of the plurality of pixel areas, when viewed from the normal direction of the main surface of the substrate, the entire gate electrode overlaps the corresponding one of the plurality of gate bus lines.

Item 15

The active matrix substrate according to any one of items 3 to 5, wherein
- in each of the plurality of pixel areas, the oxide semiconductor layer further includes another channel region,
- when viewed from a normal direction of the main surface of the substrate, the gate electrode further includes a second part overlapping the another channel region,
- the extending part of the gate electrode includes a third part being located between the first part and the second part, and
- the at least one gate contact hole is disposed on the third part of the extending part.

Item 16

The active matrix substrate according to any one of items 1 to 15, wherein
- the oxide semiconductor layer includes an In—Ga—Zn—O-based semiconductor.

Item 17

The active matrix substrate according to item 16, wherein the In—Ga—Zn—O-based semiconductor includes a crystalline portion.

Item 18

A manufacturing method of an active matrix substrate including a plurality of pixel areas and an oxide semiconductor TFT disposed to correspond to each of the plurality of pixel areas, the manufacturing method including the steps of:

(a) forming a source conductive film on a substrate and performing patterning of the source conductive film to thereby form a source metal layer including a plurality of source bus lines and a source electrode of the oxide semiconductor TFT in each of the plurality of pixel areas, the source electrode in each of the plurality of pixel areas being electrically connected to one corresponding source bus line out of the plurality of source bus lines;

(b) forming a lower insulating layer on the source metal layer, and in each of the plurality of pixel areas, forming a source opening for exposing a part of the source electrode of the oxide semiconductor TFT in the lower insulating layer;

(c) in each of the plurality of pixel areas, forming an oxide semiconductor layer of the oxide semiconductor TFT on the lower insulating layer and in the source opening, the oxide semiconductor layer being electrically connected to the source electrode in the source opening;

(d) in each of the plurality of pixel areas, forming a gate electrode on a part of the oxide semiconductor layer with a gate insulating layer being interposed between the gate electrode and the part of the oxide semiconductor layer;

(e) in each of the plurality of pixel areas, forming an interlayer insulating layer to cover the oxide semiconductor layer and the gate electrode, and forming at least one gate contact hole for exposing a part of the gate electrode in the interlayer insulating layer;

(f) forming a gate conductive film on the interlayer insulating layer and performing patterning of the gate conductive film to thereby form a gate metal layer including the plurality of gate bus lines, one gate bus line out of the plurality of gate bus lines being electrically connected to the gate electrode in the at least one gate contact hole in each of the plurality of pixel areas; and (g) forming a pixel electrode in each of the plurality of pixel areas, the pixel electrode being electrically connected to the oxide semiconductor layer of the oxide semiconductor TFT.

Item 19

The manufacturing method of the active matrix substrate according to item 18, wherein
- in the step (e), in the interlayer insulating layer, a drain opening for exposing a part of the oxide semiconductor layer is formed simultaneously with the at least one gate contact hole, and
- in the step (f), the gate metal layer includes a drain electrode of the oxide semiconductor TFT of each of the plurality of pixel areas, and the drain electrode is electrically connected to the part of the oxide semiconductor layer in the drain opening.

Item 20

A manufacturing method of an active matrix substrate including a plurality of pixel areas and an oxide semiconductor TFT disposed to correspond to each of the plurality of pixel areas, the manufacturing method including the steps of:

(A) forming a source conductive film on a substrate and performing patterning of the source conductive film to thereby form a source metal layer including a plurality of source bus lines and a source electrode of the oxide semiconductor TFT in each of the plurality of pixel areas, the source electrode in each of the plurality of pixel areas being electrically connected to one corresponding source bus line out of the plurality of source bus lines;

(B) forming a lower insulating layer on the source metal layer;

(C) in each of the plurality of pixel areas, forming an oxide semiconductor layer of the oxide semiconductor TFT on the lower insulating layer;

(D) in each of the plurality of pixel areas, forming a gate insulating film to cover the oxide semiconductor layer, and forming a source contact hole for exposing a part of the source electrode and a part of the oxide semiconductor layer in the gate insulating film and the lower insulating layer;

(E) forming a gate electrode film on the gate insulating film and performing patterning of the gate electrode film and the gate insulating film to thereby form a gate insulating layer and a first insulating layer out of the gate insulating film, and forming a gate electrode located on the gate insulating layer and a connection electrode located on the first insulating layer out of the gate electrode film, the connection electrode being electrically connected to the part of the oxide semiconductor layer and the part of the source electrode in the source contact hole;

(F) in each of the plurality of pixel areas, forming an interlayer insulating layer to cover the oxide semiconductor layer, the connection electrode, and the gate electrode, and forming at least one gate contact hole for exposing a part of the gate electrode in the interlayer insulating layer;

(G) forming a gate conductive film on the interlayer insulating layer and performing patterning of the gate conductive film to thereby form a gate metal layer including the plurality of gate bus lines, one gate bus line out of the plurality of gate bus lines being electrically connected to the gate electrode in the at least one gate contact hole in each of the plurality of pixel areas; and (H) forming a pixel electrode in each of the plurality of pixel areas, the pixel electrode being electrically connected to the oxide semiconductor layer of the oxide semiconductor TFT.

Item 21

The manufacturing method of the active matrix substrate according to item 20, wherein
  in the step (A), the source metal layer further includes a lower conductive part of the oxide semiconductor TFT in each of the plurality of pixel areas,
  the step (D) further includes forming a lower gate contact hole for exposing a part of the lower conductive part in the gate insulating film and the lower insulating layer, and
  in the step (E), the gate electrode is formed on the gate insulating layer and in the lower gate contact hole, and is electrically connected to the part of the lower conductive part in the lower gate contact hole.

Item 22

The manufacturing method of the active matrix substrate according to item 20 or 21, wherein
  in the step (F), in the interlayer insulating layer, a drain opening for exposing a part of the oxide semiconductor layer is formed simultaneously with the at least one gate contact hole, and
  in the step (G), the gate metal layer includes a drain electrode of the oxide semiconductor TFT of each of the plurality of pixel areas, and the drain electrode is electrically connected to the part of the oxide semiconductor layer in the drain opening.

Item 23

The manufacturing method of the active matrix substrate according to any one of items 20 to 22, wherein
  in the step (C), the oxide semiconductor layer includes an opening or a notched portion,
  the step (D) includes forming a source opening and a first opening to at least partially overlap the opening or the notched portion of the oxide semiconductor layer in each of the first insulating layer and the lower insulating layer, and the source contact hole includes the source opening, the first opening, and
  the opening or the notched portion of the oxide semiconductor layer.

Item 24

The manufacturing method of the active matrix substrate according to any one of items 18 to 23, wherein
  the oxide semiconductor layer includes an In—Ga—Zn—O-based semiconductor.

Item 25

The manufacturing method of the active matrix substrate according to item 24, wherein
  the In—Ga—Zn—O-based semiconductor includes a crystalline portion.

According to one embodiment of the disclosure, the active matrix substrate that includes the oxide semiconductor TFT having a top gate structure and that is capable of preventing leakage between the source and the gate due to ESD is provided.

BRIEF DESCRIPTION OF DRAWINGS

The disclosure will be described with reference to the accompanying drawings, wherein like numbers reference like elements.

DESCRIPTION OF EMBODIMENTS

First Embodiment

In the following, a first embodiment of an active matrix substrate will be described with reference to the drawings. The active matrix substrate according to the present embodiment broadly includes an active matrix substrate to be used in various display devices and electronic devices, for example.

Figure 1:
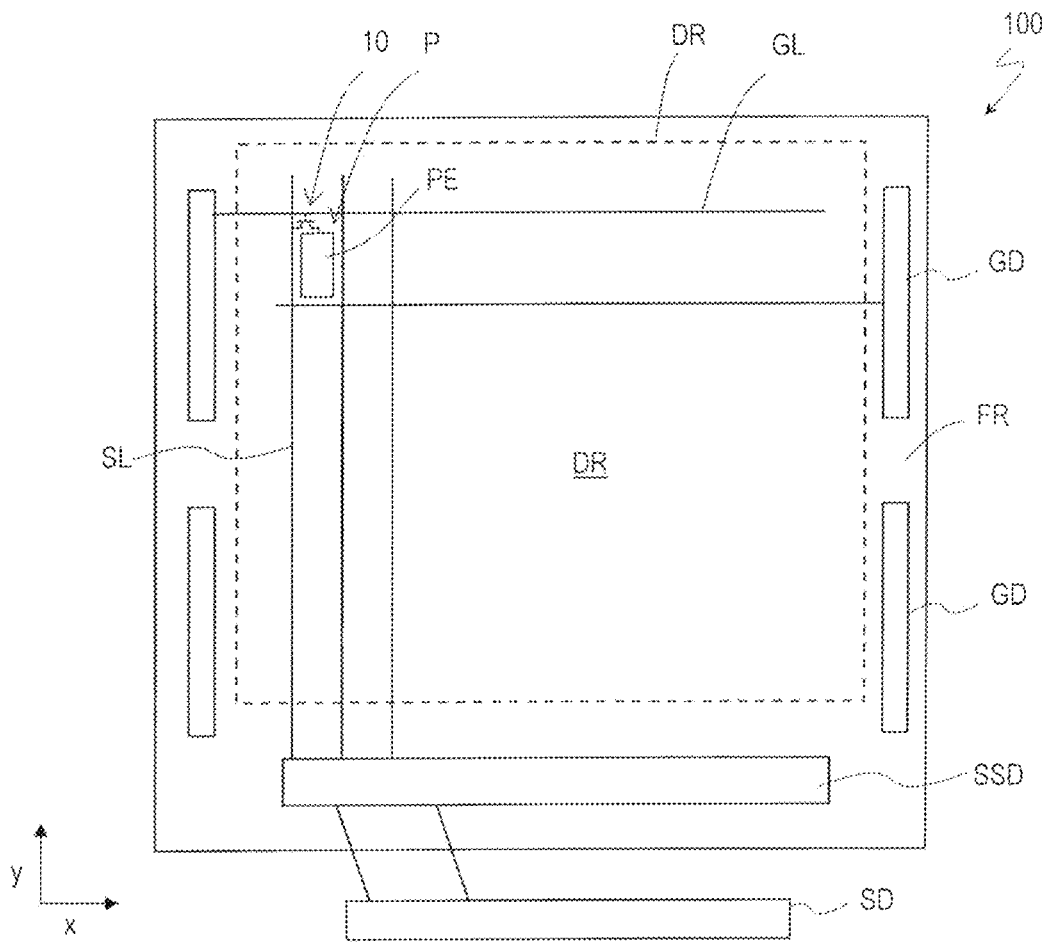
FIG. 1 is a schematic view illustrating an example of a planar structure of an active matrix substrate 100.

FIG. 1 is a diagram schematically illustrating an example of a planar structure of an active matrix substrate 100 according to the present embodiment. The active matrix substrate 100 includes a display region DR contributing to display, and a peripheral region (frame region) FR located outside of the display region DR.

Provided in the display region DR are a plurality of source bus lines SL extending in a first direction (y direction) and a plurality of gate bus lines GL extending in a second direction (x direction) intersecting (perpendicular to, in this case) the first direction. Each region surrounded by these bus lines serves as a "pixel area P". The pixel area P (also referred to as a "pixel") is a region corresponding to a pixel of a display device. A plurality of pixel areas P are disposed in a matrix shape. In each pixel area P, a pixel electrode PE and a thin film transistor (TFT) 10 are formed. A gate electrode of each TFT 10 is electrically connected to a corresponding gate bus line GL, and a source electrode thereof is electrically connected to a corresponding source bus line SL. Further, a drain electrode thereof is electrically connected to the pixel electrode PE.

For example, each source bus line SL extends across a row of pixel areas arrayed in the first direction in the display region, and is electrically connected to the source electrodes of the TFTs 10 that are disposed in each of the pixel areas of the row. For example, each gate bus line GL extends across a row of pixel areas arrayed in the second direction in the display region, and is electrically connected to the gate electrodes of the TFTs 10 that are disposed in each of the pixel areas of the row.

In the peripheral region FR, for example, a drive circuit such as a gate driver GD and a source driver SD, an SSD circuit, a plurality of terminal portions, a plurality of source-gate connecting parts, and the like are disposed. The gate driver GD and the source driver SD may be monolithically formed on the active matrix substrate 100 or may be implemented.

When the active matrix substrate 100 is applied to a display device of a transverse electrical field mode such as a Fringe Field Switching (FFS) mode, an electrode (common electrode) CE that is common to the plurality of pixel areas P is provided in the active matrix substrate 100.

Pixel Area P

A structure of the pixel area P of the active matrix substrate 100 according to the present embodiment will be described by taking an example of the active matrix substrate applied to the display device of the FFS mode. The FFS mode is a mode of a lateral electric field scheme in which a pair of electrodes is provided in one of substrates, and an electrical field is applied to liquid crystal molecules in a direction (lateral direction) parallel to a substrate plane. Although the active matrix substrate 100 includes a plurality of pixel areas P, a single pixel area P will be described below.

Figure 2A:
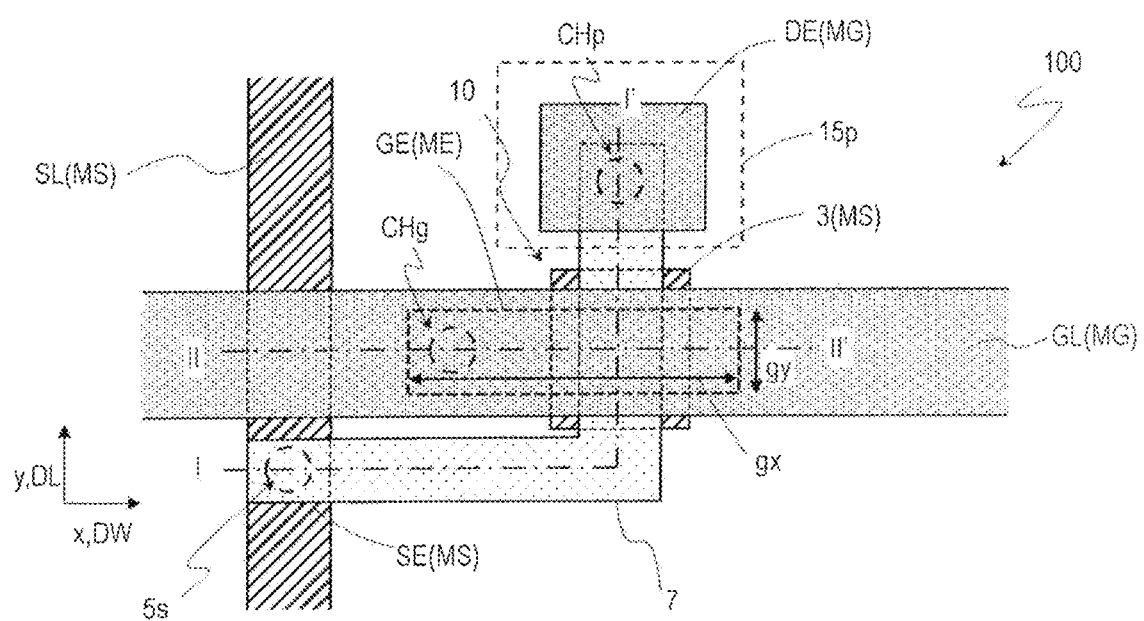
FIG. 2A is a plan view illustrating a pixel area in the active matrix substrate 100 according to the first embodiment.
Figure 2B:
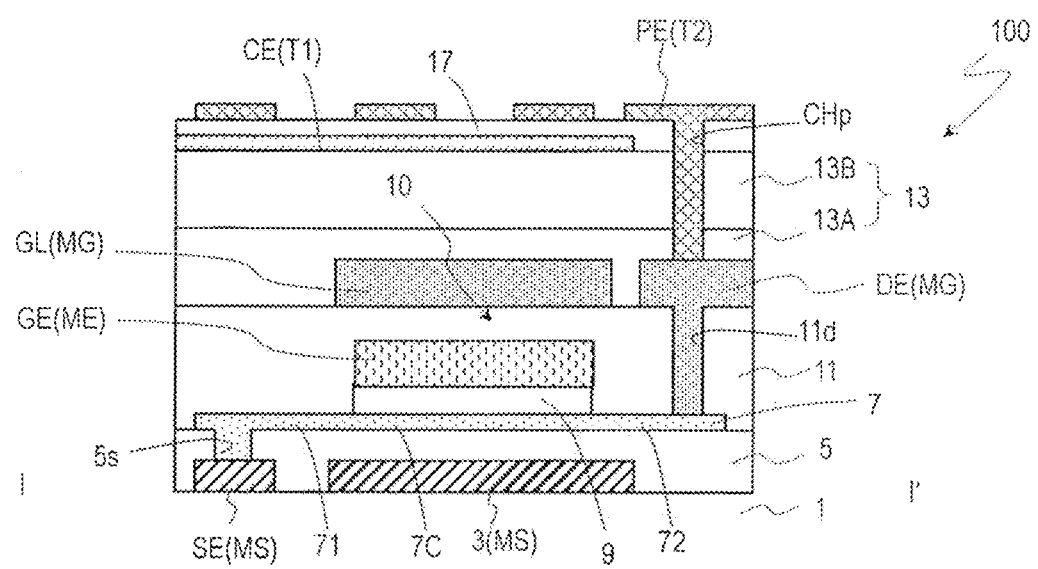
FIG. 2B is a cross-sectional view taken along the line I-I' illustrated in FIG. 2A in the active matrix substrate 100.
Figure 2C:
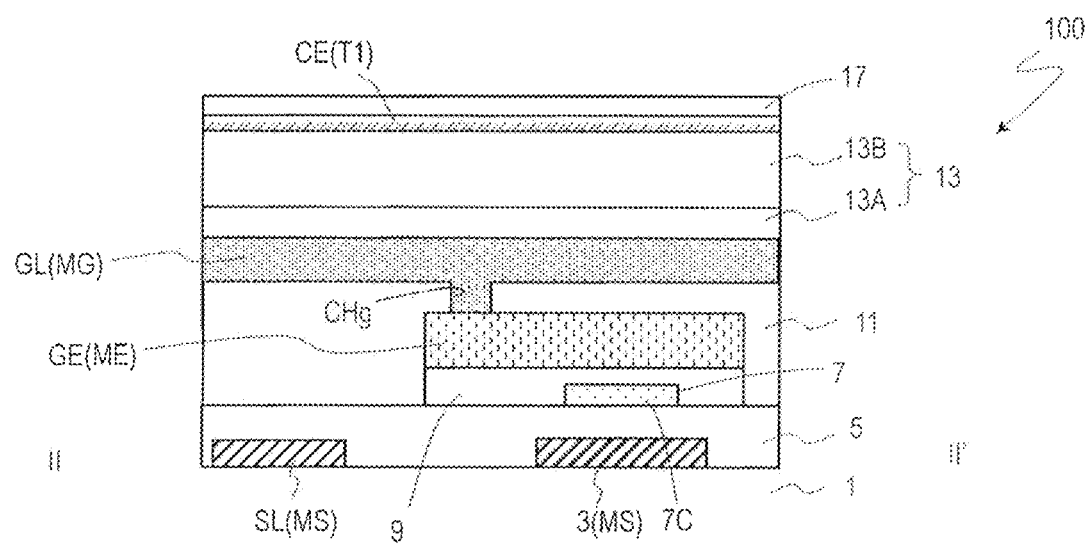
FIG. 2C is a cross-sectional view taken along the line II-II' illustrated in FIG. 2A in the active matrix substrate 100.

FIG. 2A is a plan view illustrating each pixel area P in the active matrix substrate 100. FIG. 2B is a cross-sectional view taken along the line I-I' illustrated in FIG. 2A. FIG. 2C is a cross-sectional view taken along the line II-II' illustrated in FIG. 2A.

In this specification, a layer MS including electrodes and wiring lines formed using the same conductive film (hereinafter a "source conductive film") as the source bus line SL is referred to as a "source metal layer", and a layer MG including electrodes and wiring lines formed using the same conductive film (hereinafter a "gate conductive film") as the gate bus line GL is referred to as a "gate metal layer". The source metal layer MS is located closer to the substrate side than the gate metal layer MG (bottom source wiring line structure). Further, in the present embodiment, the gate electrode of each pixel TFT is provided between the source metal layer MS and the gate metal layer MG. A layer ME including electrodes and wiring lines formed using the same conductive film (hereinafter a "gate electrode film") as the gate electrode is referred to as a "gate electrode layer".

In addition, a layer T1 including electrodes and wiring lines formed using the same transparent conductive film (hereinafter a "first transparent conductive film") as the common electrode is referred to as a "first transparent conductive layer", and a layer T2 including electrodes and wiring lines formed using the same transparent conductive film (hereinafter a "second transparent conductive film") as the pixel electrode is referred to as a "second transparent conductive layer".

In the drawings, after a reference sign of each constituent element, a layer in which its electrode and wiring line and the like are formed may be represented in parentheses. For example, for the electrode or the wiring line formed in the gate metal layer MG, "(MG)" may be denoted after its reference sign.

Each pixel area P includes a substrate 1, a pixel TFT (hereinafter simply a "TFT") 10 supported by the substrate 1, a pixel electrode PE, and a common electrode CE.

The TFT 10 includes an oxide semiconductor layer 7, a gate electrode GE disposed on a part of the oxide semiconductor layer 7 with a gate insulating layer 9 being interposed therebetween, a source electrode SE, and a drain electrode DE. It is only necessary that the TFT 10 is arranged to correspond to the pixel area P, and a part thereof may be located in another pixel area.

The source electrode SE of the TFT 10 is formed in the source metal layer MS, and is electrically connected to a corresponding source bus line SL. The source electrode SE may be integrally formed with the source bus line SL. The source electrode SE may be connected to the source bus line SL, or may be a part of the source bus line SL. The source metal layer MS is covered by a lower insulating layer 5.

The oxide semiconductor layer 7 is disposed on the lower insulating layer 5. The oxide semiconductor layer 7 includes a channel region 7C, and a first region 71 and a second region 72 that are disposed on respective both sides of the channel region 7C. The first region 71 and the second region 72 may be, for example, low-resistance regions having specific resistance lower than the channel region 7C.

The first region 71 of the oxide semiconductor layer 7 is electrically connected to a corresponding source bus line SL in a source contact portion. In the source contact portion, a source opening 5s for exposing a part of the source electrode SE (here, a part of the source bus line SL) is formed in the lower insulating layer 5. The first region 71 of the oxide semiconductor layer 7 is electrically connected to the source electrode SE in the source opening 5s. The first region 71 may come into direct contact with the exposed part of the source electrode SE.

The gate electrode GE is disposed on the gate insulating layer 9 so as to overlap at least the channel region 7C when viewed from a normal direction of a main surface of the substrate 1 (hereinafter shortened as a "normal direction of the substrate 1"). The gate electrode GE is formed in a different layer from the gate bus line GL. The gate electrode GE is disposed for each pixel area P. In other words, the gate electrode GE of each pixel area P is disposed to be separated from the gate electrode of an adjacent pixel area (has a separate pattern).

The gate insulating layer 9 may cover the channel region 7C and may not cover the first region 71 and the second region 72. In the present example, the gate insulating layer 9 is disposed only between the gate electrode GE and the oxide semiconductor layer 7. The side surface of the gate insulating layer 9 and the side surface of the gate electrode GE may be aligned with each other. Such a structure is obtained by performing patterning of the gate electrode GE and the gate insulating layer 9 by using the same mask.

The oxide semiconductor layer 7, the gate insulating layer 9, and the gate electrode GE are covered by an interlayer insulating layer 11. On the interlayer insulating layer 11, the gate metal layer MG including the gate bus line GL is disposed.

The gate electrode GE of the TFT 10 is electrically connected to a corresponding gate bus line GL in a gate contact portion. In the gate contact portion, a gate contact hole CHg for exposing a part of the gate electrode GE is formed in the interlayer insulating layer 11. At least one gate contact hole CHg is formed for one gate electrode GE. The gate bus line GL is disposed on the interlayer insulating layer 11 and in the gate contact hole CHg, and is electrically connected to the gate electrode GE in the gate contact hole CHg. The gate bus line GL may come into direct contact with the gate electrode GE.

The drain electrode DE is disposed on the interlayer insulating layer 11. The drain electrode DE may be, for example, formed in the same layer (specifically, in the gate metal layer MG) as the gate bus line GL. The drain electrode DE is connected to the second region 72 of the oxide semiconductor layer 7 in a drain contact portion. In the drain contact portion, a drain opening 11d for exposing a part of the second region 72 is formed in the interlayer insulating layer 11. The drain electrode DE is electrically connected to the second region 72 of the oxide semiconductor layer 7 in the drain opening 11d. The drain electrode DE may come into direct contact with the exposed part of the second region 72.

The TFT 10 is disposed on the substrate 1 side of the oxide semiconductor layer 7, and may include a lower conductive part 3 that functions as a light blocking layer. The lower conductive part 3 may be formed by using, for example, the source conductive film (specifically, in the source metal layer MS). The lower conductive part 3 may be disposed to overlap at least the channel region 7C of the oxide semiconductor layer 7 when viewed from the normal direction of the substrate 1. In this manner, deterioration of characteristics of the oxide semiconductor layer 7 caused by light (light of a backlight) from the substrate 1 side can be prevented.

The TFT 1 and the gate metal layer MG are covered by an upper insulating layer 13. The upper insulating layer 13 includes, for example, an inorganic insulating layer (passivation film) 13A. As illustrated in the drawings, the upper insulating layer 13 may include a layered structure including the inorganic insulating layer 13A and an organic insulating layer 13B that is formed on the inorganic insulating layer 13A. The organic insulating layer 13B may not be formed. Alternatively, the organic insulating layer 13B may be formed only in the display region.

The pixel electrode PE and the common electrode CE are disposed above the upper insulating layer 13 so as to partially overlap each other with a dielectric layer 17 being interposed therebetween. In the present example, the common electrode CE is disposed on the upper insulating layer 13, and the pixel electrode PE is disposed on the common electrode CE with the dielectric layer 17 being interposed therebetween. Note that, as will be described later, the common electrode CE may be disposed on the pixel electrode PE with the dielectric layer 17 being interposed therebetween.

The pixel electrode PE is disposed for each pixel area P. In each pixel area P, in the pixel electrode PE, one or a plurality of slits (openings) or notched portions are provided. The pixel electrode PE is connected to the drain electrode DE of the TFT 10 in the pixel contact portion. In the present example, in the pixel contact portion, a pixel contact hole CHp for exposing a part of the drain electrode DE is formed in the dielectric layer 17 and the upper insulating layer 13. The pixel electrode PE is electrically connected to the drain electrode DE in the pixel contact hole CHp. The pixel electrode PE may come into direct contact with the exposed part of the drain electrode DE.

The common electrode CE need not necessarily be separated for each pixel area P. For example, the common electrode CE may have an opening 15p in a region in which the pixel contact portion is formed, and may be formed across the entire pixel area P except the pixel contact portion.

Problems of Bottom Source Structure Substrate of Related Art and Effects According to Present Embodiment As described above, the inventors of the disclosure discovered that, in a bottom source structure substrate of the related art, ESD may be caused in an edge portion of the oxide semiconductor layer of the oxide semiconductor TFT below the gate bus line. In the following, the discovery made by the inventors of the disclosure will be described with reference to the drawings.

Figure 16A:
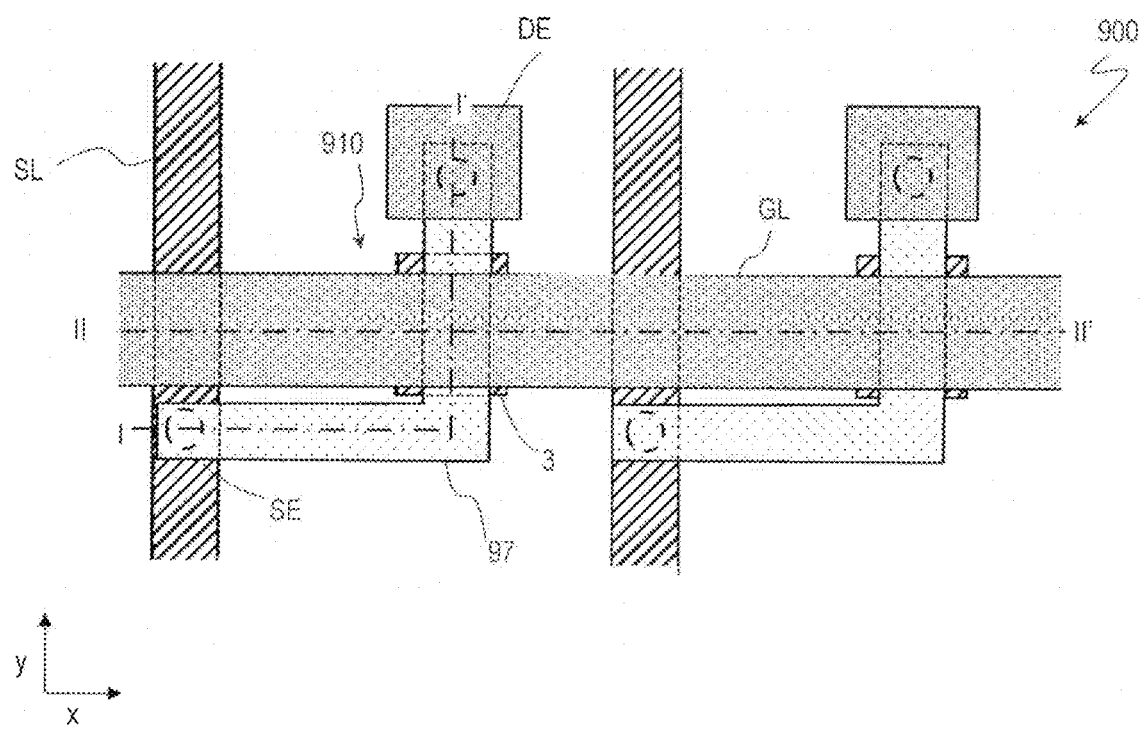
FIG. 16A is a plan view for describing an active matrix substrate 900 according to a reference example.
Figure 16B:
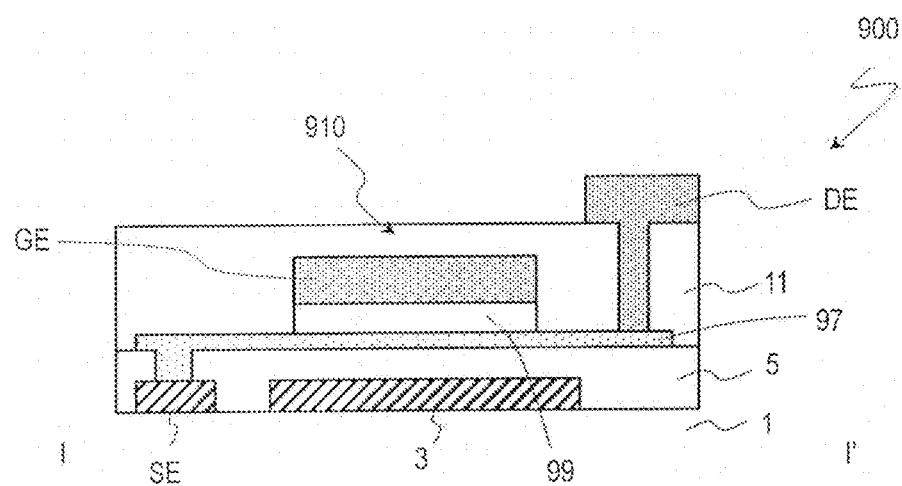
FIG. 16B is a cross-sectional view taken along the line I-I' illustrated in FIG. 16A in the active matrix substrate 900 according to the reference example.
Figure 16C:
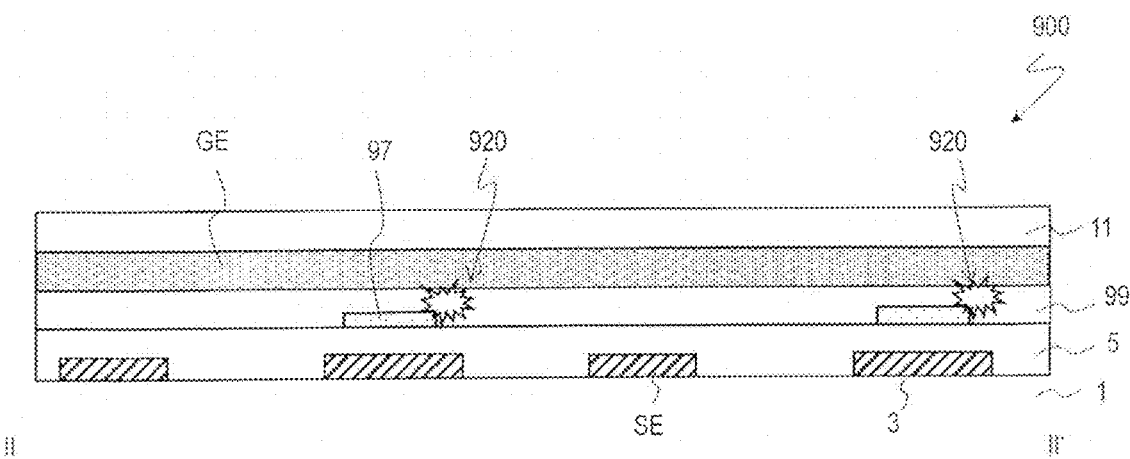
FIG. 16C is a cross-sectional view taken along the line II-II' illustrated in FIG. 16A in the active matrix substrate 900 according to the reference example.

FIG. 16A is a plan view illustrating a part of an active matrix substrate 900 according to a reference example. FIGS. 16B and 16C are cross-sectional views taken along the line I-I' and the line II-II' illustrated in FIG. 16A, respectively. In FIGS. 16A to 16C, a layered structure of the pixel TFT and each bus line is illustrated, and transparent electrodes such as the pixel electrode are omitted. Further, in the display region of the active matrix substrate 900, a plurality of pixel areas are arrayed in a matrix shape in a row direction and a column direction; however, here, only two pixel areas of the plurality of pixel areas are illustrated. For the sake of simplicity, in FIGS. 16A to 16C, constituent elements similar to those of the active matrix substrate 100 according to the present embodiment are denoted by the same reference signs, and description thereof is omitted.

The active matrix substrate 900 according to the reference example includes, in each pixel area, a top gate TFT 910 supported on the substrate 1 and a pixel electrode (not illustrated).

The TFT 910 includes an oxide semiconductor layer 97, and a gate electrode GE that is disposed on a part of the oxide semiconductor layer 97 with a gate insulating layer 99 being interposed therebetween. The gate electrode GE of the TFT 910 is formed in the gate metal layer. Here, the gate electrode GE is integrally formed with a corresponding gate bus line GL by using the same conductive film as the gate bus line GL.

In the reference example, the gate bus line GL (including a part of the TFT 901 functioning as the gate electrode GE) is disposed on the oxide semiconductor layer 97 of the TFT 910 with only the gate insulating layer 99 being interposed therebetween. When viewed from the normal direction of the substrate 1, the gate bus line GL extends in the x direction across the entire display region and crosses the oxide semiconductor layer 97 of a plurality of pixel areas arrayed in the x direction.

In the active matrix substrate 900 according to the reference example, electric charge accumulated in the long gate bus line GL moves in the gate bus line GL in a manufacture process (array process) of the TFT 910 or the subsequent processes. With this, at a position below the gate bus line GL, ESD 920 may be caused at an edge portion of the oxide semiconductor layer 97, which may cause leakage between the source and the gate. This may be a factor of reduction of a yield rate.

Note that a material and thickness of the gate insulating layer 99 interposed between the gate bus line GL and the oxide semiconductor layer 97 are determined depending on characteristics required for the TFT 910. Thus, for example, it is difficult to increase the thickness of the gate insulating layer 99 with the aim of preventing occurrence of the ESD 920.

In contrast, in the active matrix substrate 100 according to the present embodiment, as illustrated in FIGS. 2A to 2C, an edge portion of the oxide semiconductor layer 7 of the TFT 10 of each pixel area P is covered by the gate electrode GE with the gate insulating layer 9 being interposed therebetween. The gate electrode GE is an island-shape electrode provided for each pixel area. The area of the gate electrode GE is extremely smaller than the area of the gate bus line GL, and thus the amount of electric charge stored in each gate electrode GE is smaller than that of the gate bus line GL. Note that the gate bus line GL of an upper layer has large electric charge. However, electric charge in the gate bus line GL less easily moves to each gate electrode GE through the gate contact hole CHg having a width smaller than that of the gate bus line GL. Because the amount of electric charge accumulated in the gate electrode GE is small, the occurrence of the ESD at the edge portion of the oxide semiconductor layer 7 can be prevented at a position below the gate electrode GE.

A part of the edge portion of the oxide semiconductor layer 7 may not be covered by the gate electrode GE but may be covered by the gate bus line GL when viewed from the normal direction of the substrate 1. In this case as well, the interlayer insulating layer 11 as well as the gate insulating layer 9 is interposed between the gate bus line GL having large capacitance and the oxide semiconductor layer 7, and thus the occurrence of the ESD caused by the electric charge of the gate bus line GL can be further prevented as compared to the reference example.

Configuration of Gate Contact Portion

The gate electrode GE is disposed to at least partially overlap a corresponding gate bus line GL when viewed from the normal direction of the substrate 1. For example, the gate electrode GE may extend in the same direction (x direction) as the gate bus line GL. As illustrated in the drawings, for example, the x direction and the y direction may be substantially parallel with a channel width direction DW and a channel longitudinal direction DL in the TFT 10, respectively. A length (in the present example, the length of the channel width direction DW) gx of the gate electrode GE in the x direction may be less than a pitch Px of the pixel area in the x direction, and may be equal to or less than ½ of Px. A length (in the present example, the length of the channel longitudinal direction DL) gy of the gate electrode GE in the y direction may be less than a black matrix width of a counter substrate (not illustrated), and may be, for example, equal to or less than the width of the gate bus line GL. By reducing a size of the gate electrode GE to be small, the electric charge accumulated in the gate electrode GE is further reduced, and thus the occurrence of the ESD can be further effectively prevented. In contrast, when the size of the gate electrode GE is excessively small, it may be difficult to form the gate contact portion. Thus, regarding the size and the position of the gate electrode GE, the gate electrode GE is designed to at least partially overlap the gate contact hole CHg even when misalignment occurs.

As illustrated in FIG. 2A, the gate contact portion may be disposed not to overlap the channel region 7C when viewed from the normal direction of the substrate 1. Alternatively, the gate contact portion may be disposed to overlap the channel region 7C.

In the following, a relationship between the size of the gate electrode GE and the position of the gate contact portion will be described in detail with reference to the drawings.

Figure 3:
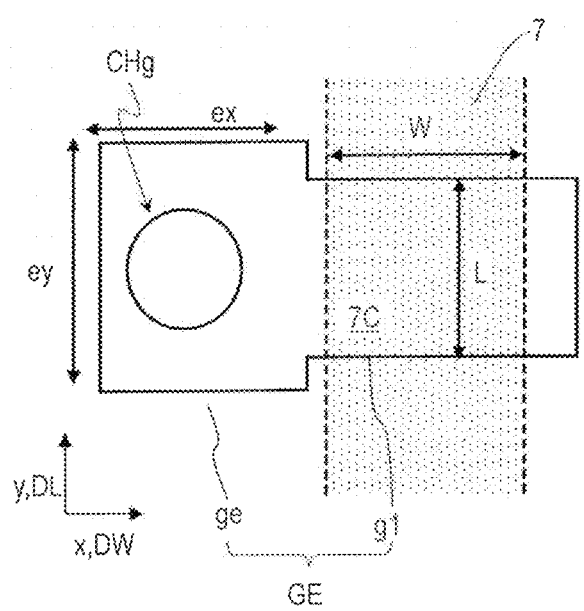
FIG. 3 is a plan view illustrating an example of a disposition relationship between a gate electrode and a gate contact hole.

FIG. 3 is a plan view illustrating an example of a disposition relationship between the gate electrode GE and the gate contact hole CHg in the gate contact portion. In this specification, the position and the size of the gate contact hole CHg refer to the position and the size of the "bottom face" of the gate contact hole CHg when the side surface of the gate contact hole CHg has a tapered shape.

In the example illustrated in FIG. 3, the gate electrode GE is arranged to extend not to overlap the oxide semiconductor layer 7 from a part above the channel region 7C when viewed from the normal direction of the substrate 1. In this specification, when viewed from the normal direction of the substrate 1, a part g1 of the gate electrode GE overlapping the oxide semiconductor layer 7 (that is, the channel region 7C) is referred to as a "first part", and a part ge thereof extending from the first part so as not to overlap the oxide semiconductor layer 7 is referred to as an "extending part". For example, the extending part ge may extend from a part above the channel region 7C in a direction (for example, the channel width direction DW) that is different from the channel longitudinal direction DL. The gate contact portion is disposed on the extending part ge. In other words, the gate contact hole CHg of the interlayer insulating layer 11 is formed to expose the extending part ge of the gate electrode GE.

The position of the gate contact hole CHg and the width of the extending part ge of the gate electrode GE may be designed in consideration of positioning accuracy, so that the entire gate contact hole CHg of the interlayer insulating layer 11 overlaps the extending part ge of the gate electrode GE. Depending on the area of the channel region 7C, as illustrated in FIG. 3, a length ey of the extending part ge of the gate electrode GE in the channel longitudinal direction DL may be set larger than a length (specifically, a channel length L of the TFT 10) of the first part g1 in the channel longitudinal direction DL.

As an example, when the channel length L of the TFT 10 is 4 μm, a channel width W is 4 μm, and the width of the gate contact hole CHg is 3 μm, each of the length ey of the channel longitudinal direction DL and a length ex of the channel width direction DW in the extending part ge of the gate electrode GE may be set to 7 μm. In this manner, even when misalignment (for example, less than ±2) occurs, the entire gate contact hole CHg can be disposed to overlap the extending part ge.

The gate contact portion may be disposed in a region (hereinafter a "source metal absent region") in which the source metal layer MS of the substrate 1 including the source bus line SL, the lower conductive part 3, and the like is not formed. With the gate contact portion being disposed in the source metal absent region, occurrence of defects such as leakage failure can be prevented even when a part of the gate contact hole CHg does not overlap the gate electrode GE due to misalignment.

When the gate contact portion is disposed in the source metal absent region, the size of the gate electrode GE can be further reduced than that in the example illustrated in FIG. 3. Note that "when the gate contact portion is disposed in the source metal absent region" refers to a case in which, for example, the entire gate contact hole CHg is designed to be located in the source metal absent region.

Figure 4A:
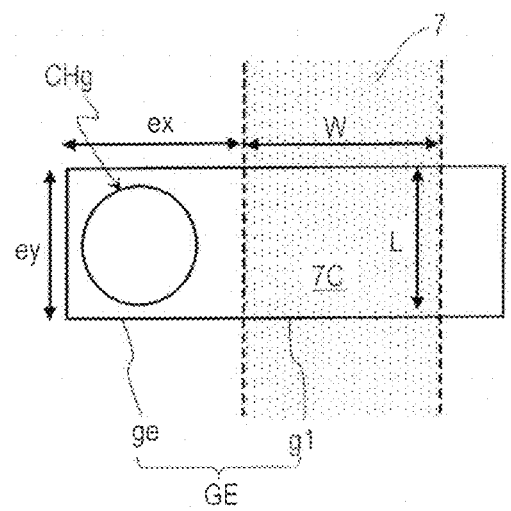
FIG. 4A is a plan view illustrating another example of a disposition relationship between the gate electrode and the gate contact hole.
Figure 4B:
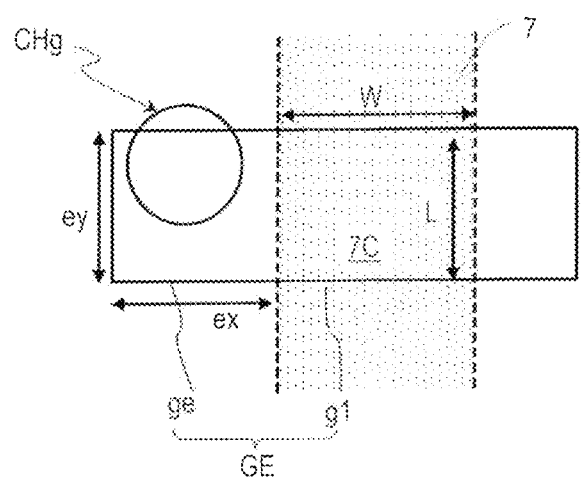
FIG. 4B is a plan view illustrating yet another example of a disposition relationship between the gate electrode and the gate contact hole.
Figure 4C:
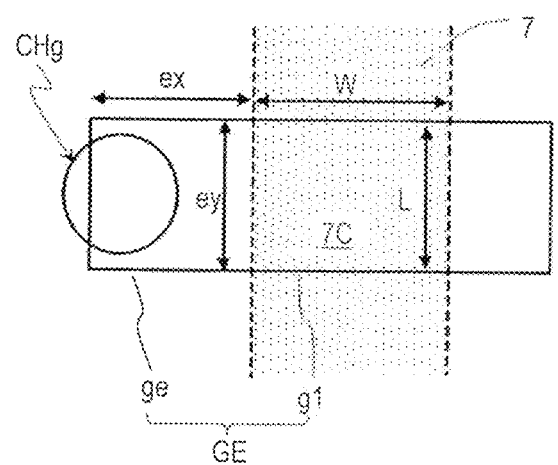
FIG. 4C is a plan view illustrating yet another example of a disposition relationship between the gate electrode and the gate contact hole.

FIGS. 4A to 4C are each a plan view illustrating another example of a disposition relationship between the gate electrode GE and the gate contact hole CHg in the gate contact portion. FIG. 4A illustrates a case in which misalignment does not occur, FIG. 4B illustrates a case in which misalignment occurs in the channel longitudinal direction DL, and FIG. 4C illustrates a disposition relationship between the gate electrode GE and the gate contact hole CHg in a case in which misalignment occurs in the channel width direction DW (in a direction away from the channel region 7C).

As illustrated in FIGS. 4B and 4C, at least a part of the gate contact hole CHg is located on the gate electrode GE even when misalignment occurs. Thus, electrical connection with the gate electrode GE and the gate bus line GL can be secured.

As an example, the shortest distance between the edge portion of the gate electrode GE and the gate contact hole CHg may be designed to be 1 µm, for example. Further, the distance between the gate contact hole CHg and the channel region 7C may be designed to be 2 µm or more, for example, so that the gate bus line GL is not connected to the oxide semiconductor layer 7. Specifically, when the channel length L of the TFT 10 is 4 µm, the channel width W is 4 µm, and the width of the gate contact hole CHg is 3 µm, the length ey of the extending part ge of the gate electrode GE in the channel longitudinal direction DL may be set to 4 µm, and the length ex in the channel width direction DW may be set to 6 µm.

Figure 4D:
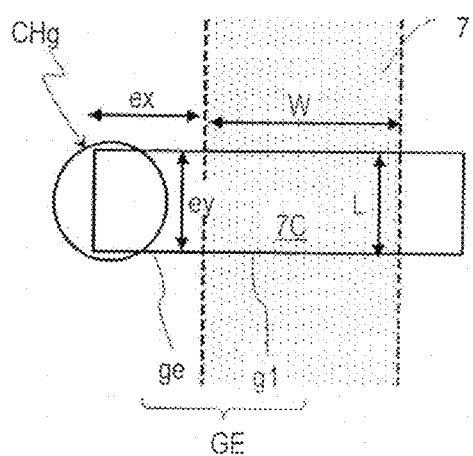
FIG. 4D is a plan view illustrating yet another example of a disposition relationship between the gate electrode and the gate contact hole.

In addition, as illustrated in FIG. 4D, the size of the extending part ge of the gate electrode GE may be further reduced so that only a part of the gate contact hole CHg overlaps the gate electrode GE. In this manner, the occurrence of the ESD due to electric charge of the gate electrode GE can be more effectively prevented. Further, a pixel aperture ratio can be reduced.

Figure 5A:
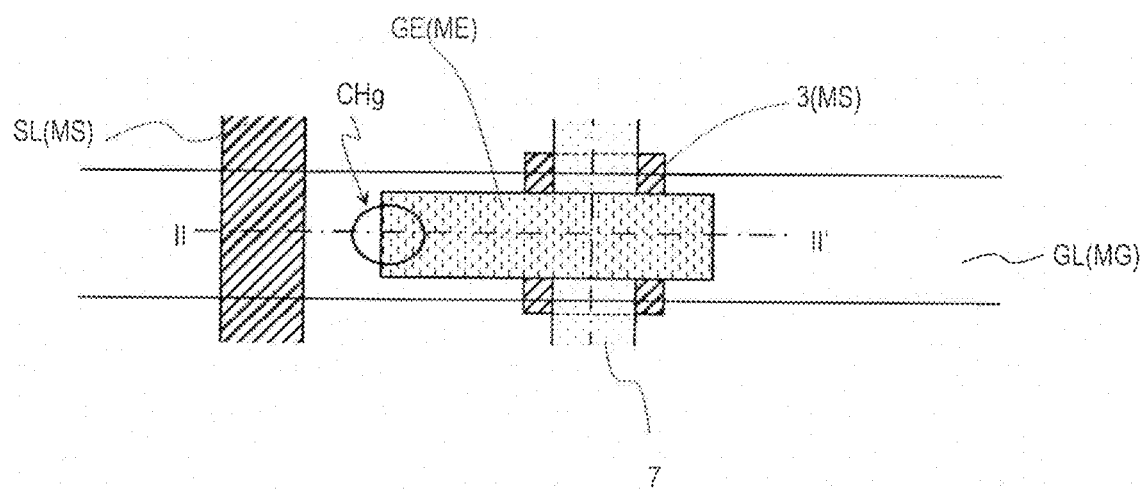
FIG. 5A is a plan view illustrating an example of a gate contact portion when misalignment occurs.
Figure 5B:
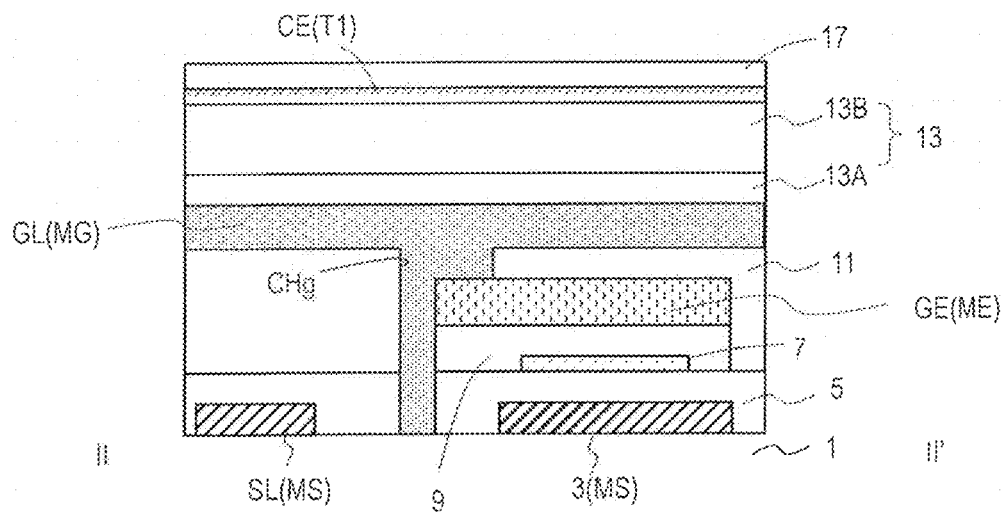
FIG. 5B is a cross-sectional view illustrating the gate contact portion when misalignment occurs.

FIGS. 5A and 5B are a plan view and a cross-sectional view illustrating the gate contact portion when a part of the gate contact hole CHg does not overlap the gate electrode GE (for example, FIGS. 4C and 4D).

As illustrated in FIG. 5A, the gate contact hole CHg is disposed to cross the edge portion of the gate electrode GE when viewed from the normal direction of the substrate 1. In this case, as illustrated in FIG. 5B, a part of the gate contact hole CHg may extend beyond the extending part ge of the gate electrode GE and penetrate the lower insulating layer 5 located below. The gate bus line GL comes into contact with an insulating surface of the substrate 1, for example, in the gate contact hole CHg penetrating the lower insulating layer 5. The source metal layer MS is not formed below the lower insulating layer 5, and thus the gate bus line GL and the gate electrode GE are not electrically connected to wiring lines and electrodes such as the source bus line SL and the lower conductive part 3 in the source metal layer MS. Thus, when misalignment occurs or even when the width of the extending part ge of the gate electrode GE is designed to be smaller than the width of the gate contact hole CHg (FIG. 4D), leakage failure between the source and the gate or the like is not caused. Note that, although not illustrated, this also holds true for a case in which misalignment occurs in the channel longitudinal direction DL.

First Modification

The active matrix substrate according to the first modification is different from the active matrix substrate 100 in that a plurality of gate contact portions (a plurality of gate contact holes CHg) are disposed for one gate electrode GE.

Figure 6A:
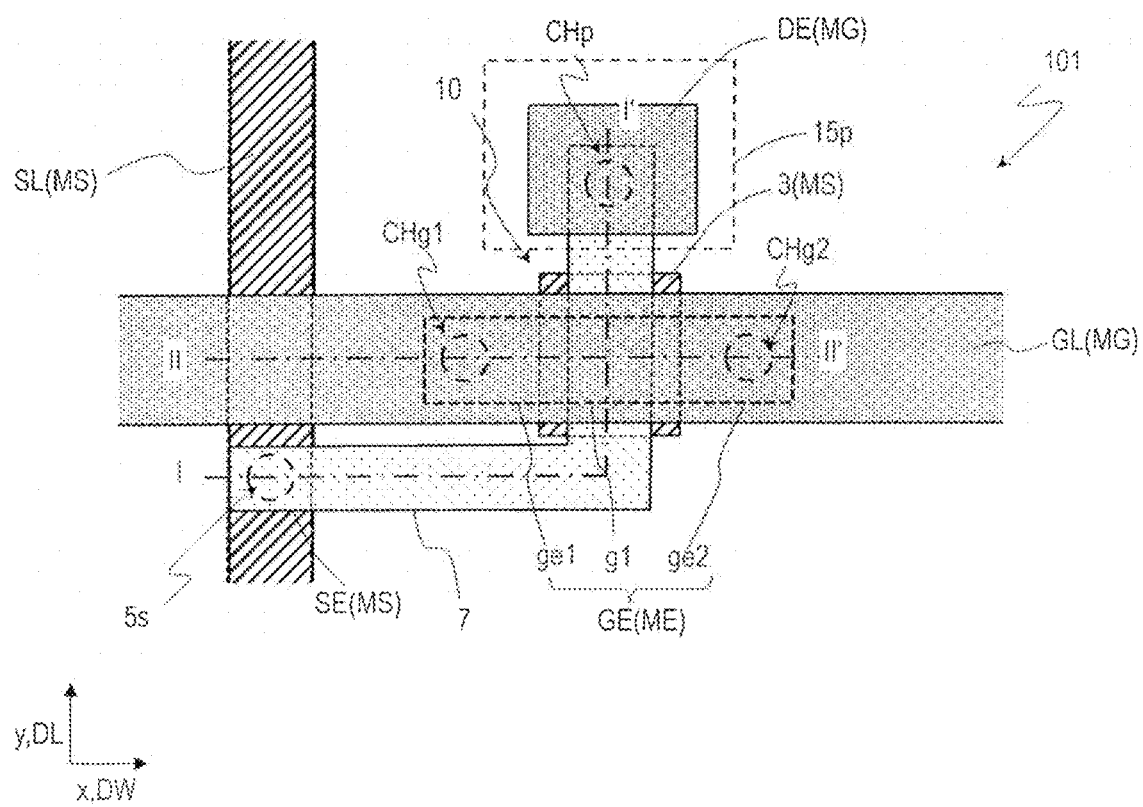
FIG. 6A is a plan view illustrating the pixel area in an active matrix substrate 101 according to the first modification.
Figure 6B:
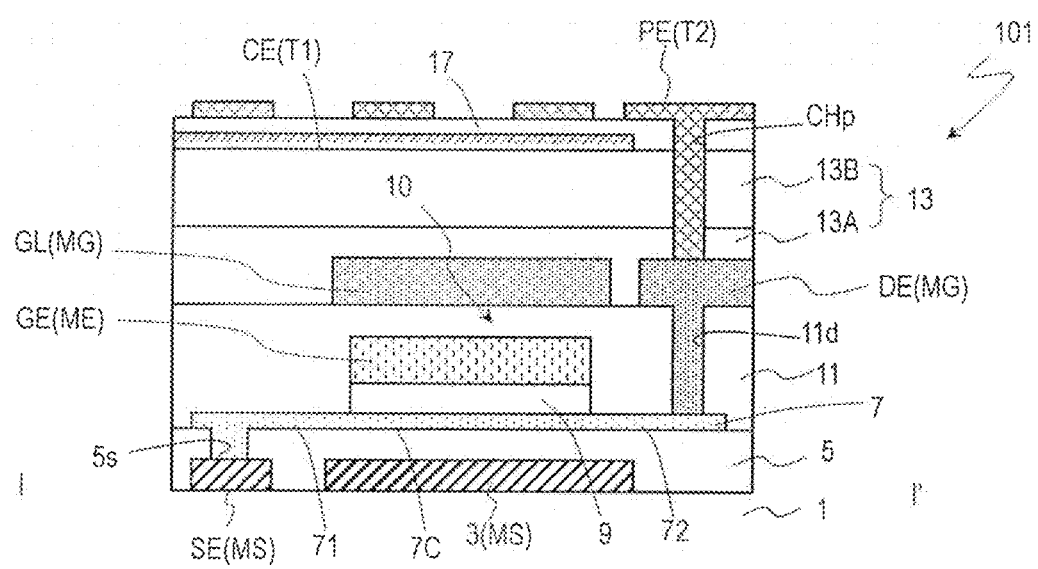
FIG. 6B is a cross-sectional view taken along the line I-I' illustrated in FIG. 6A in the active matrix substrate 101.
Figure 6C:
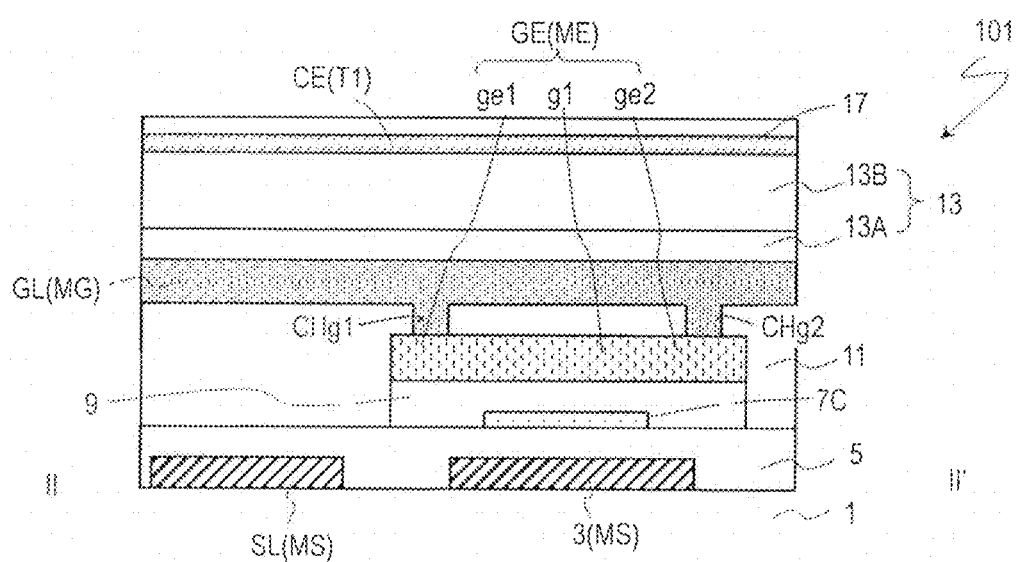
FIG. 6C is a cross-sectional view taken along the line II-II' illustrated in FIG. 6A in the active matrix substrate 101.

FIG. 6A is a plan view illustrating each pixel area P in an active matrix substrate 101 according to the first modification. FIG. 6B is a cross-sectional view taken along the line I-I' illustrated in FIG. 6A. FIG. 6C is a cross-sectional view taken along the line II-II' illustrated in FIG. 3A. Constituent elements similar to those of FIGS. 2A to 2C are denoted by the same reference signs and description thereof will be omitted.

In the active matrix substrate 101 according to the first modification, when viewed from the normal direction of the substrate 1, the gate electrode GE includes a first part g1 overlapping the oxide semiconductor layer 7 (that is, the channel region 7C), and a first extending part ge1 and a second extending part ge2 on both sides of the first part g1, which extend in a direction (here, the channel width direction) that is different from the channel longitudinal direction. In the interlayer insulating layer 11, a gate contact hole CHg1 for exposing a part of the first extending part ge1 of the gate electrode GE and a gate contact hole CHg2 for exposing a part of the second extending part ge2 are formed. The gate bus line GL is electrically connected to the first extending part ge1 and the second extending part ge2 of the gate electrode GE in the gate contact holes CHg1 and CHg2, respectively. Although not illustrated, three or more gate contact holes may be formed in the interlayer insulating layer 11.

According to the first modification, the contact area in the gate contact portion can be increased, and thus contact resistance can be reduced.

Second Modification

An active matrix substrate according to the second modification is different from the active matrix substrate 100 in that the gate contact portion is disposed on the first part g1 of the gate electrode GE (specifically, in the channel region 7C).

Figure 7A:
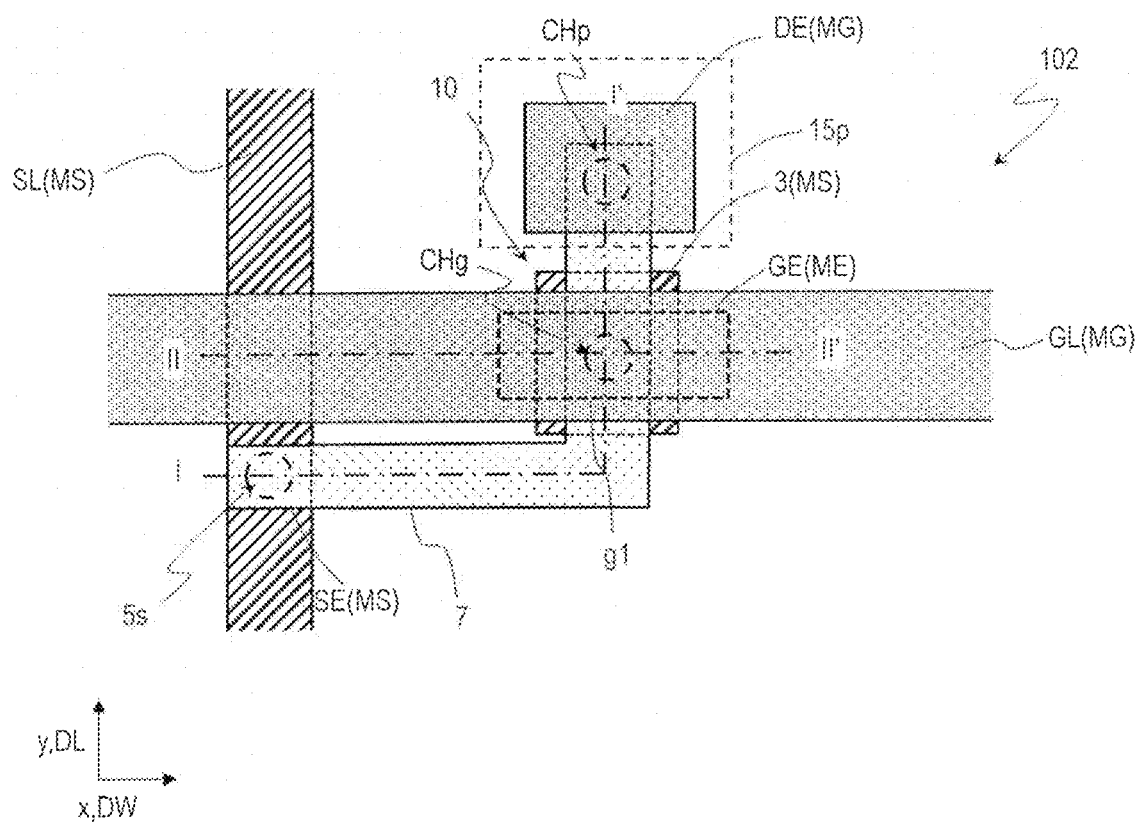
FIG. 7A is a plan view illustrating the pixel area in an active matrix substrate 102 according to the second modification.
Figure 7B:
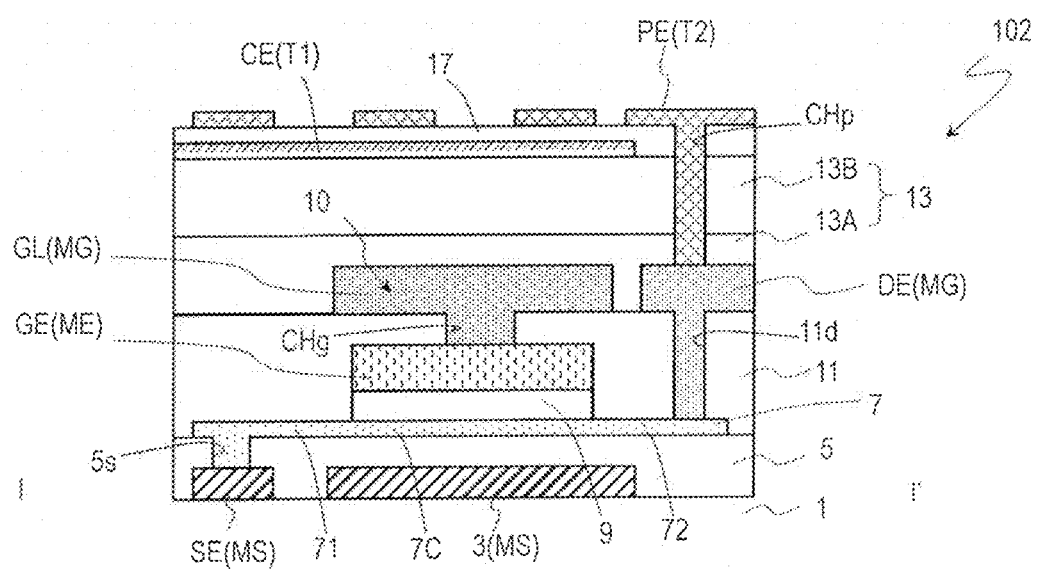
FIG. 7B is a cross-sectional view taken along the line I-I' illustrated in FIG. 7A in the active matrix substrate 102.
Figure 7C:
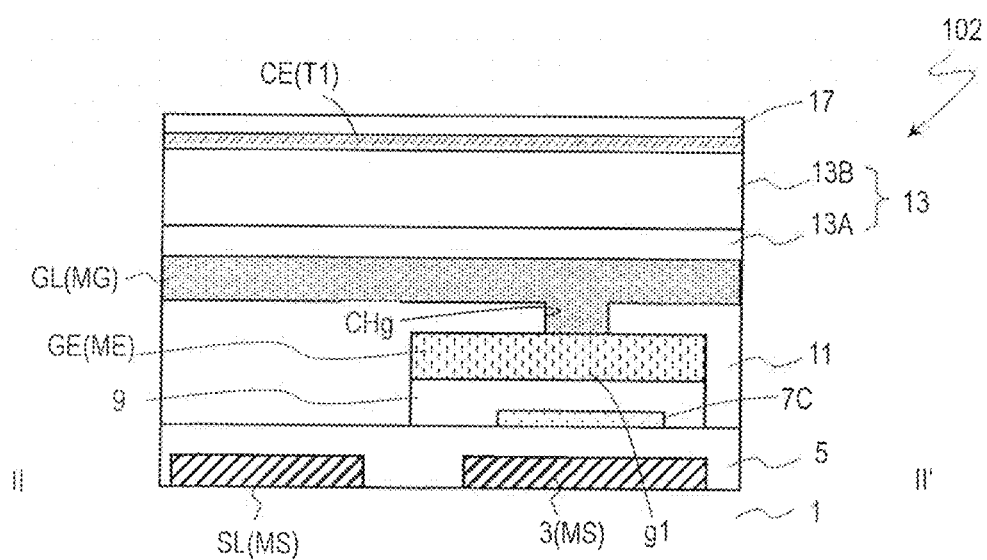
FIG. 7C is a cross-sectional view taken along the line II-II' illustrated in FIG. 7A in the active matrix substrate 102.

FIG. 7A is a plan view illustrating each pixel area P in an active matrix substrate 102 according to the second modification. FIG. 7B is a cross-sectional view taken along the line I-I' illustrated in FIG. 7A. FIG. 7C is a cross-sectional view taken along the line II-II' illustrated in FIG. 7A. Constituent elements similar to those of FIGS. 2A to 2C are denoted by the same reference signs and description thereof will be omitted.

In the active matrix substrate 102, the gate contact hole CHg of the gate contact portion is disposed to overlap the channel region 7C when viewed from the normal direction of the substrate 1. The gate contact hole CHg exposes a part of the first part g1 of the gate electrode GE. The gate bus line GL is connected to the exposed part of the first part g1 in the gate contact hole CHg. Here, although the entire gate contact hole CHg overlaps the channel region 7C, the gate contact hole CHg may partially overlap the channel region 7C. According to the configuration, the extending part ge of the gate electrode GE can be reduced smaller than the active matrix substrate 100.

Note that, depending on the channel length L and the channel width W of the TFT 10, it may be difficult to dispose the gate contact hole CHg in the channel region 7C. The present modification is suitably applied when the channel length L and the channel width W are sufficiently larger than the width of the gate contact hole CHg.

Third Modification

An active matrix substrate according to the third modification is different from the active matrix substrate 100 in that the oxide semiconductor layer 7 includes a plurality of channel regions between the first region 71 and the second region 72.

Figure 8:
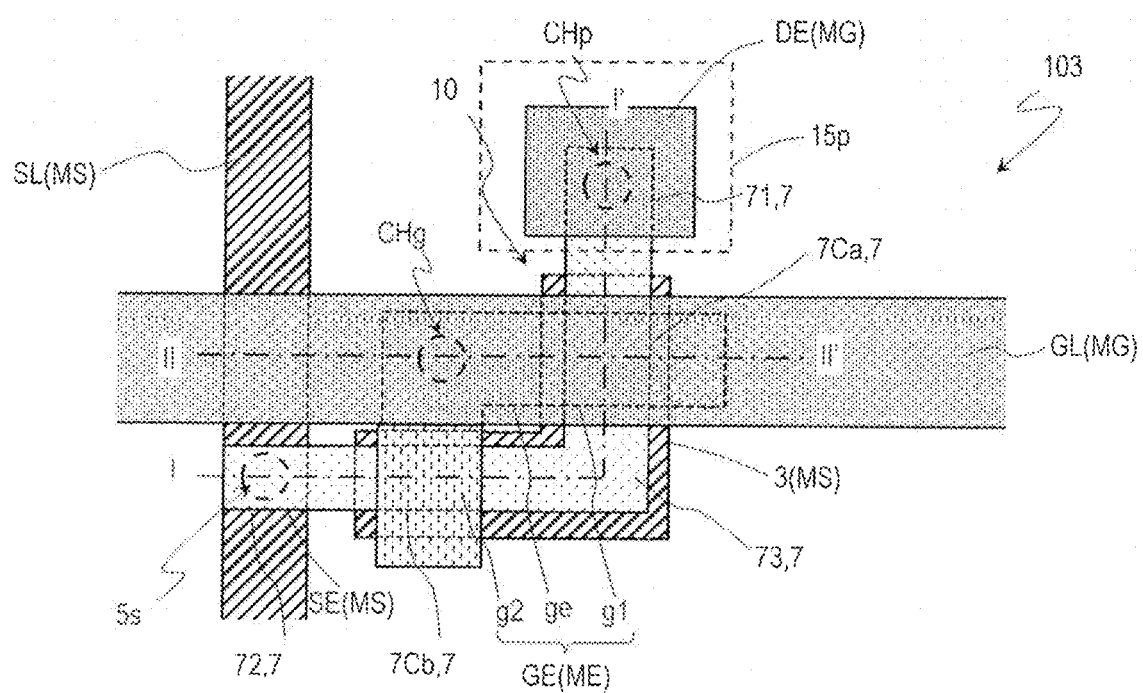
FIG. 8 is a plan view illustrating the pixel area in an active matrix substrate 103 according to the third modification.

FIG. 8 is a plan view illustrating each pixel area P in an active matrix substrate 103 according to the third modification. Constituent elements similar to those of FIGS. 2A to 2C are denoted by the same reference signs and description thereof will be omitted.

In the active matrix substrate 103, the oxide semiconductor layer 7 further includes two channel regions 7Ca and 7Cb disposed between the first region 71 and the second region 72, and a low-resistance region (third region) 73 disposed between these channel regions 7Ca and 7Cb. The gate electrode GE is disposed to overlap the channel regions 7Ca and 7Cb when viewed from the normal direction of the substrate 1. In the present example, the gate electrode GE is an island-shape electrode having an L-like shape and extends to cross the oxide semiconductor layer 7 at two positions when viewed from the normal direction of the substrate 1. The gate electrode GE includes a first part g1 that overlaps the channel region 7Ca and a second part g2 that overlaps the channel region 7Cb. The extending part ge of the gate electrode GE includes a third part located between the first part g1 and the second part g2. The gate contact hole CHg of the gate contact portion is, for example, disposed on the extending part ge (third part). The lower conductive part 3 is disposed to overlap the channel regions 7Ca and 7Cb when viewed from the normal direction of the substrate 1.

Note that the shapes of the oxide semiconductor layer 7 and the gate electrode GE are not limited to the shapes illustrated in the drawings. For example, the gate electrode GE may extend in the x direction along the gate bus line GL, and the oxide semiconductor layer 7 may extend in a U-like shape in such a manner as to cross the gate electrode GE twice.

Manufacturing Method of Active Matrix Substrate

Next, a manufacturing method of the active matrix substrate according to the present embodiment will be described with reference to the drawings. Here, description will be given by taking an example of a manufacturing method of the active matrix substrate 100.

FIGS. 9A to 9L are each a schematic view for describing the manufacturing method of the active matrix substrate 100. (a) and (b) of each diagram are process cross-sectional views, and (c) of each diagram is a process plan view. (a) and (b) of each diagram are process cross-sectional views taken along the line A-A' and the line B-B' of (c) of each diagram, respectively. The following will describe a manufacturing method of one unit region out of a plurality of unit regions in the active matrix substrate 100.

Step 1: Formation of Source Metal Layer MS (FIG. 9A)

A source conductive film (having a thickness of, for example, 50 nm or more and 500 nm or less) is formed on the substrate 1 by sputtering, for example. Subsequently, patterning of the source conductive film is performed with a known photolithography process. Here, a resist film is formed on the source conductive film and the resist film is exposed to light by using a first photomask, and a first resist layer (not illustrated) is thereby formed. Etching (for example, wet etching) of the source conductive film is performed, with the first resist layer being used as a mask.

Figure 9A:
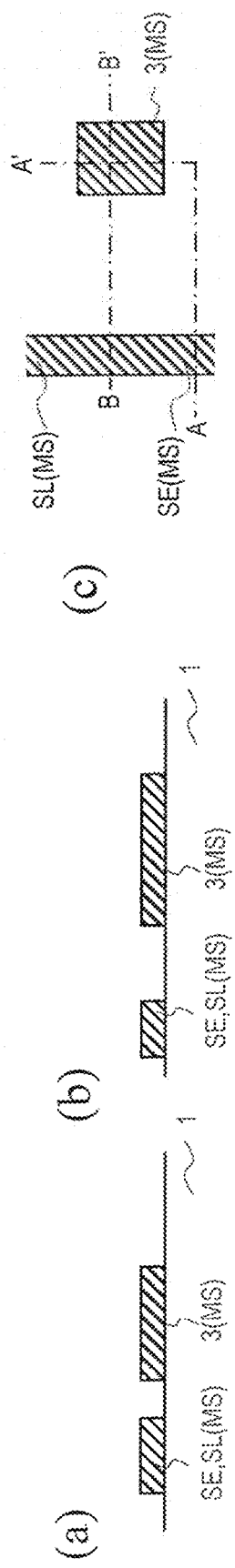
FIG. 9A is a diagram illustrating a manufacturing method of the active matrix substrate 100, and (a) and (b) thereof are process cross-sectional views and (c) thereof is a process plan view. In the following, the alphabet in parenthesis after the number of each diagram denotes a part of the diagram (partial diagram).

In this manner, as illustrated in FIG. 9A, the source metal layer MS including the source bus line SL, the source electrode SE, and the lower conductive part 3 functioning as the light blocking layer of the TFT is formed.

As the substrate 1, a transparent substrate with insulating property, for example, a glass substrate, a silicon substrate, a heat-resistant plastic substrate (resin substrate), or the like can be used.

The material of the source conductive film is not particularly limited, and a film containing metal such as aluminum (Al), tungsten (W), molybdenum (Mo), tantalum (Ta), chromium (Cr), titanium (Ti), and copper (Cu), an alloy thereof, or a metal nitride thereof can be appropriately used. Further, a layered film obtained by layering such a plurality of films may be used. Here, as the source conductive film, a layered film having Ti as a lower layer and Cu as an upper layer is used.

Step 2: Formation of Lower Insulating Layer 5 (FIG. 9B)

Figure 9B:
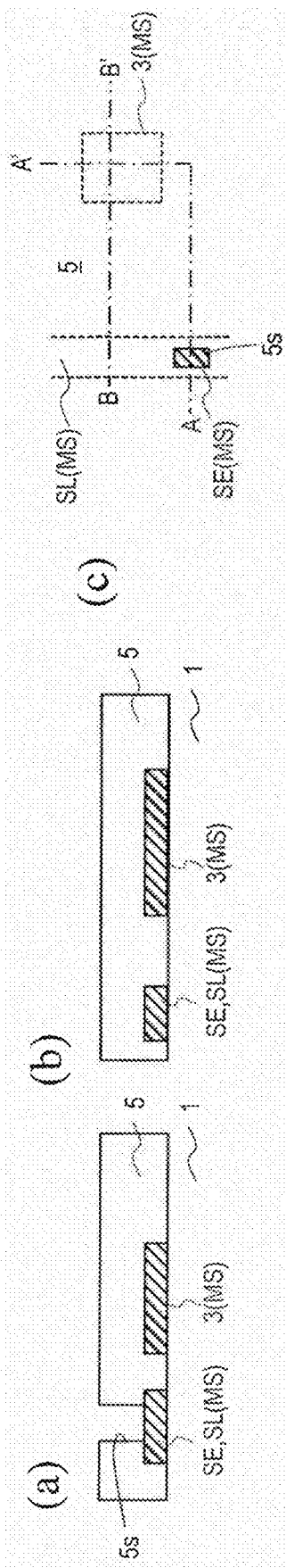
FIG. 9B is a diagram illustrating the manufacturing method of the active matrix substrate 100, and (a) and (b) thereof are process cross-sectional views and (c) thereof is a process plan view.

Subsequently, as illustrated in FIG. 9B, the lower insulating layer 5 (having a thickness of, for example, 200 nm or more and 600 nm or less) is formed to cover the source metal layer MS. Subsequently, patterning of the lower insulating layer 5 is performed with a known photolithography process. In this manner, in each pixel area, the source opening 5s for exposing a part of the source electrode SE (or the source bus line SL) is formed The lower insulating layer 5 is formed by CVD, for example. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 5 may be a single layer or may include a layered structure. For example, a silicon nitride (SiNx) layer, a silicon nitride oxide layer, or the like may be formed on a substrate side (lower layer) in order to prevent diffusion of impurities and the like from the substrate 1, and a silicon dioxide ($SiO_2$) layer, a silicon oxynitride layer, or the like may be formed on a layer (upper layer) on the former layer in order to ensure insulating properties. Here, a silicon oxide ($SiO_2$) layer (having a thickness of 350 nm, for example) is formed as the lower insulating layer 5 by CVD, for example. Alternatively, a layered film having a silicon nitride (SiNx) layer (having a thickness of 50 to 600 nm) as a lower layer and a silicon oxide ($SiO_2$) layer (having a thickness of 50 to 600 nm) as an upper layer may be formed as the lower insulating layer 5.

Figure 9C:
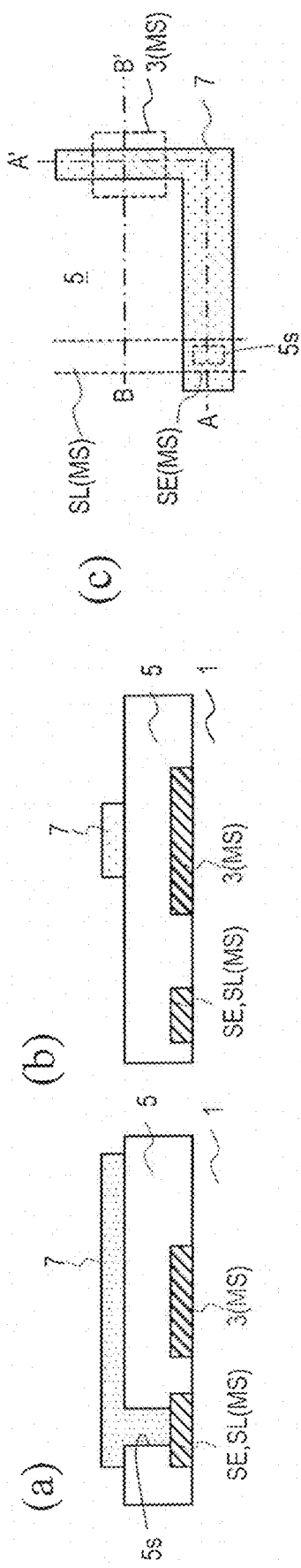
FIG. 9C is a diagram illustrating the manufacturing method of the active matrix substrate 100, and (a) and (b) thereof are process cross-sectional views and (c) thereof is a process plan view.

Step 3: Formation of Oxide Semiconductor Layer 7 (FIG. 9C)

Subsequently, an oxide semiconductor film (having a thickness of, for example, 15 nm or more and 200 nm) is formed on the lower insulating layer 5. Subsequently, annealing treatment of the oxide semiconductor film may be performed. Subsequently, patterning of the oxide semiconductor film is performed with a known photolithography process. In this manner, as illustrated in FIG. 9C, the oxide semiconductor layer 7 to be an active layer of the TFT 10 is obtained. The oxide semiconductor layer 7 is connected to the source electrode SE in the source opening 5s. The oxide semiconductor layer 7 may come into direct contact with the source electrode SE.

The oxide semiconductor film may be formed by sputtering, for example. Here, as the oxide semiconductor film, an In—Ga—Zn—O-based semiconductor film (having a thickness of, 50 nm) containing In, Ga, and Zn is formed.

The patterning of the oxide semiconductor film may be, for example, performed with wet etching using a PAN-based etching solution containing phosphorus acid, nitric acid, and acetic acid.

Step 4: Formation of Gate Insulating Layer 9 and Gate Electrode GE (FIGS. 9D to 9F)

Figure 9D:
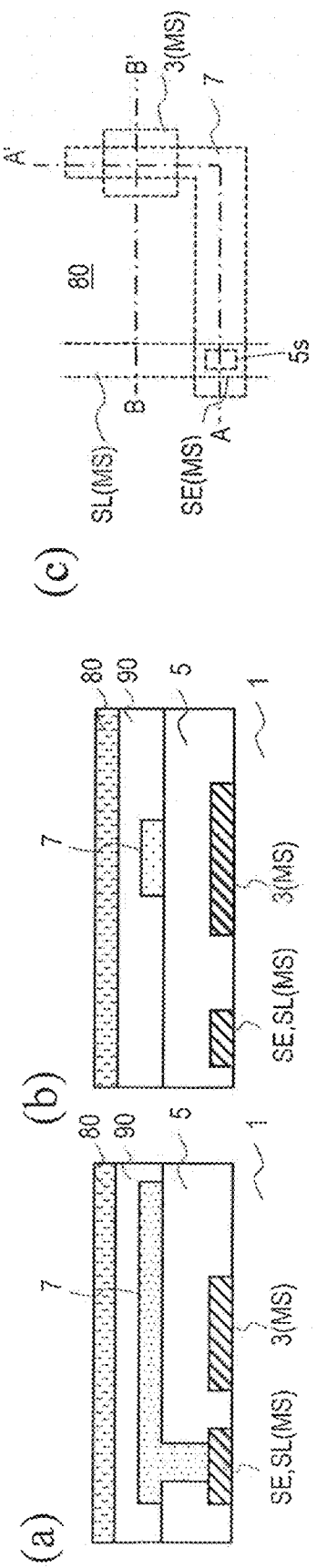
FIG. 9D is a diagram illustrating the manufacturing method of the active matrix substrate 100, and (a) and (b) thereof are process cross-sectional views and (c) thereof is a process plan view.
Figure 9E:
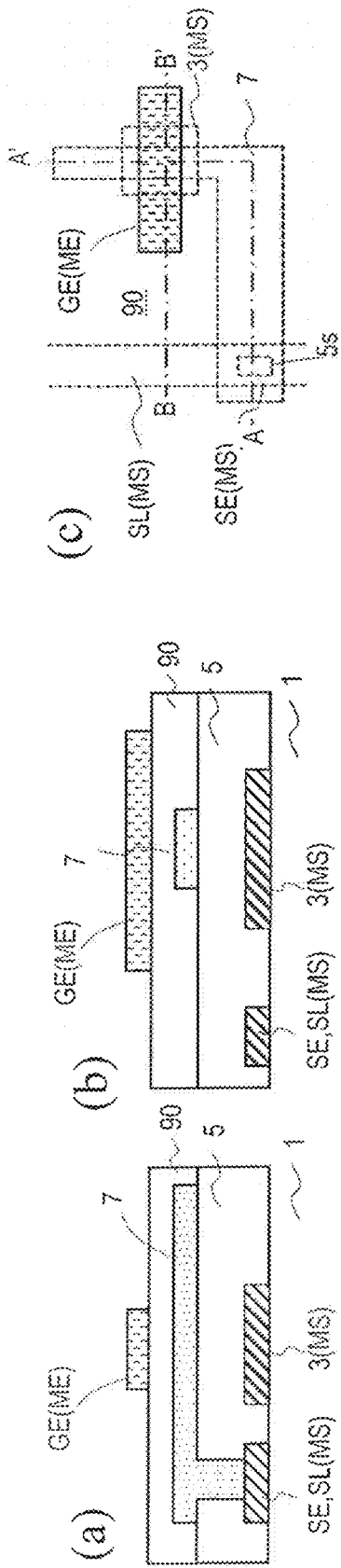
FIG. 9E is a diagram illustrating the manufacturing method of the active matrix substrate 100, and (a) and (b) thereof are process cross-sectional views and (c) thereof is a process plan view.
Figure 9F:
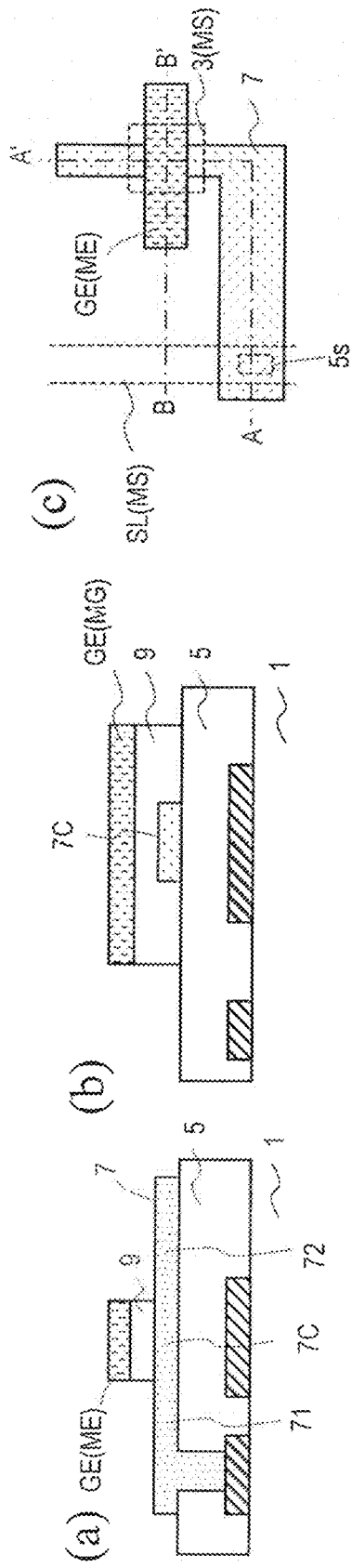
FIG. 9F is a diagram illustrating the manufacturing method of the active matrix substrate 100, and (a) and (b) thereof are process cross-sectional views and (c) thereof is a process plan view.

Subsequently, as illustrated in FIG. 9D, the gate insulating film (having a thickness of, for example, 80 nm or more and 250 nm or less) 90 and the gate electrode film (having a thickness of, for example, 50 nm or more and 500 nm or less) 80 are formed in the mentioned order so as to cover the oxide semiconductor layer 7.

As the gate insulating film 90, an insulating film (insulating film illustrated as the lower insulating layer 5) similar to the lower insulating layer 5 can be used. Here, as the gate insulating film 90, a silicon oxide ($SiO_2$) layer is formed.

As the gate electrode film 80, for example, metal such as molybdenum (Mo), tungsten (W), aluminum (Al), copper (Cu), titanium (Ti), and tantalum (Ta) or an alloy of these can be used. The gate electrode film 80 may have a layered structure including a plurality of layers made of different conductive materials. Here, a layered film having a Ti film as a lower layer and a Cu film as an upper layer is used.

Subsequently, as illustrated in FIG. 9E, patterning (for example, wet etching) of the gate electrode film 80 is performed with a known photolithography process, and the gate electrode layer ME including the gate electrode GE is thereby formed.

Subsequently, as illustrated in FIG. 9F, patterning (for example, dry etching) of the gate insulating film 90 is performed by using the same resist mask as that in the patterning of the gate electrode film 80, and the gate insulating layer 9 is thereby formed. According to the method, when viewed from the normal direction of the substrate 1, the side surface of the gate electrode GE and the side surface of the gate insulating layer 9 are aligned with each other.

Instead of the method, the resist mask may be removed after the patterning of the gate electrode film 80, and patterning of the gate insulating film 90 may be performed, with the patterned gate electrode film (gate electrode layer ME) being used as a mask.

Alternatively, the gate insulating film 90 may be formed to cover the oxide semiconductor layer 7, and the gate insulating layer 9 may be formed by patterning the gate insulating film 90. Subsequently, the gate electrode film 80 may be formed to cover the gate insulating layer 9, and the gate electrode layer ME may be formed by patterning the gate electrode film 80.

Through the present process, of the oxide semiconductor layer 7, when viewed from the normal direction of the substrate 1, the region 7C overlapping the gate electrode GE is formed into the "channel region", and the regions located on both the sides of the region are formed into the first region 71 and the second region 72.

Subsequently, resistance reducing treatment (for example, plasma treatment) of the oxide semiconductor layer 7 may be performed. In this manner, when viewed from the normal direction of the main surface of the substrate 1, specific resistance of the first region 71 and the second region 72 that do not overlap either the gate electrode layer ME or the gate insulating layer 9 of the oxide semiconductor layer 7 can be reduced lower than specific resistance of the channel region 7C that overlaps these. The method, condition, and the like of the resistance reducing treatment are described in, for example, JP 2008-40343 A. The entire contents of the disclosure of JP 2008-40343 A are incorporated herein by reference. Note that, even when the resistance reducing treatment is not performed, by forming the interlayer insulating layer 11 to be described later, resistance of a part of the oxide semiconductor layer 7 in contact with the interlayer insulating layer 11 may be reduced lower than a part thereof not in contact with the interlayer insulating layer 11.

Figure 9G:
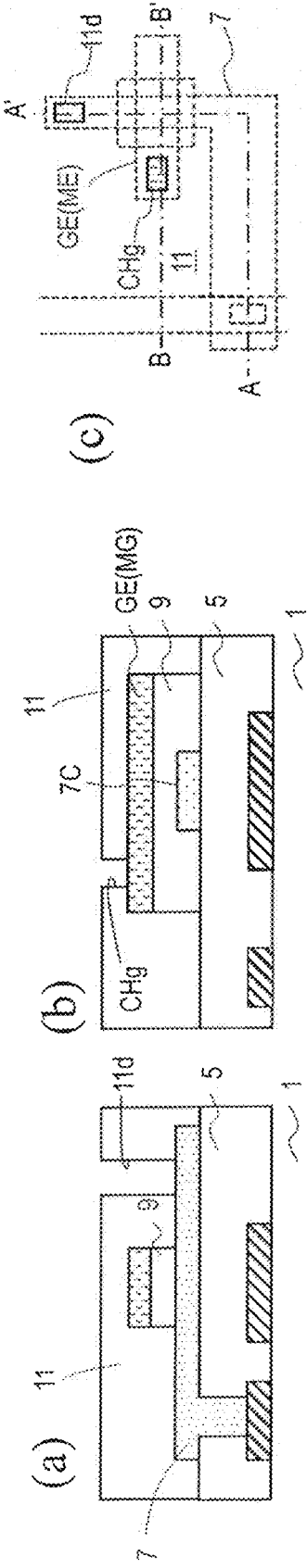
FIG. 9G is a diagram illustrating the manufacturing method of the active matrix substrate 100, and (a) and (b) thereof are process cross-sectional views and (c) thereof is a process plan view.

Step 5: Formation of Interlayer Insulating Layer 11 (FIG. 9G)

Subsequently, the interlayer insulating layer (having a thickness of, for example, 100 nm or more and 1000 nm or less) 11 that covers the oxide semiconductor layer 7, the gate insulating layer 9, and the gate electrode GE is formed. Subsequently, for example, the drain opening 11d for exposing a part of the second region 72 of the oxide semiconductor layer 7 and the gate contact hole CHg for exposing a part of the gate electrode GE are formed in the interlayer insulating layer 11 by dry etching.

The interlayer insulating layer 11 can be formed with a single layer or a multi-layer of an inorganic insulating layer such as a silicon oxide film, a silicon nitride film, a silicon oxide nitride film, and a nitride silicon oxide film. The thickness of the inorganic insulating layer may be 100 nm or more and 1000 nm or less. Here, as the interlayer insulating layer 11, for example, an $SiO_2$ layer (having a thickness of, for example, 300 nm) is formed by CVD.

Figure 9H:
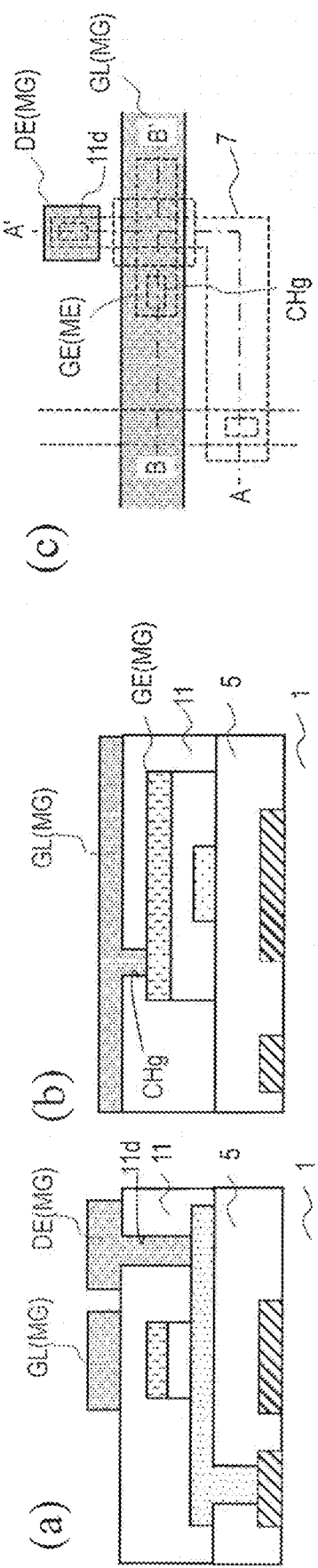
FIG. 9H is a diagram illustrating the manufacturing method of the active matrix substrate 100, and (a) and (b) thereof are process cross-sectional views and (c) thereof is a process plan view.

Step 6: Formation of Gate Metal Layer MG (FIG. 9H)

Subsequently, the gate conductive film (having a thickness of, for example, 50 nm or more and 500 nm or less) is formed on the interlayer insulating layer 11, and patterning of the gate conductive film is performed. In this manner, as illustrated in FIG. 9H, the gate metal layer MG including the gate bus line GL and the drain electrode DE is formed. The drain electrode DE and the gate bus line GL are disposed to be spaced apart from each other, and are electrically separated from each other.

The gate bus line GL is disposed on the interlayer insulating layer 11 and in the gate contact hole CHg, and comes into contact with the gate electrode GE in the gate contact hole CHg.

The drain electrode DE is disposed on the interlayer insulating layer 11 and in the drain opening 11d, and comes into contact with the second region 72 of the oxide semiconductor layer 7 in the drain opening 11d.

As the gate conductive film, for example, a film containing metal such as aluminum (Al), tungsten (W), molybdenum (Mo), tantalum (Ta), chromium (Cr), titanium (Ti), and copper (Cu), an alloy thereof, or a metal nitride thereof can be appropriately used. Further, a layered film obtained by layering such a plurality of films may be used. Here, as the gate conductive film, a layered film having Ti as a lower layer and Cu as an upper layer can be used. In the present example, the gate electrode GE and the gate bus line GL are formed by using the same material (Ti and Cu). Note that the gate bus line GL and the gate electrode GE may be formed by using different materials. For example, the gate bus line GL may be formed by using a material having resistance lower than resistance of a material of the gate electrode GE. In this manner, electric charge accumulated in the gate bus line GL is even less liable to move to the gate electrode GE, and thus the occurrence of the ESD may be able to be prevented more effectively.

Step 7: Formation of Upper Insulating Layer 13 (FIG. 9I)

Figure 9I:
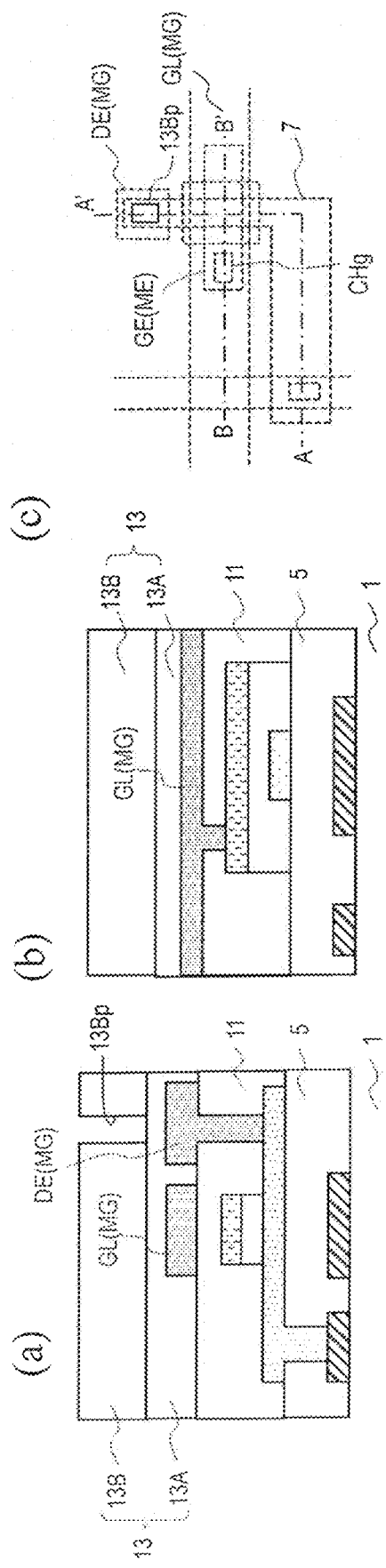
FIG. 9I is a diagram illustrating the manufacturing method of the active matrix substrate 100, and (a) and (b) thereof are process cross-sectional views and (c) thereof is a process plan view.

Next, as illustrated in FIG. 9I, the upper insulating layer 13 is formed to cover the interlayer insulating layer 11 and the gate metal layer MG. Here, as the upper insulating layer 13, the inorganic insulating layer 13A (having a thickness of, for example, 50 nm or more and 500 nm or less) and the organic insulating layer 13B (having a thickness of, for example, 1 to 3 μm, preferably 2 to 3 μm) are formed in the mentioned order. The entire part located in a non-display region in the organic insulating layer 13B may be removed. Note that the organic insulating layer 13B need not be formed.

As the inorganic insulating layer 13A, an inorganic insulating film (insulating film illustrated as the interlayer insulating layer 11) similar to the interlayer insulating layer 11 can be used. Here, as the inorganic insulating layer 13A, for example, an SiNx layer (having a thickness of, 300 nm) is formed by CVD. The organic insulating layer 13B may be, for example, an organic insulating film (for example, an acrylic resin film) containing a photosensitive resin material. Subsequently, patterning of the organic insulating layer 13B is performed. In this manner, in each pixel area P, an opening 13Bp for exposing a part of the inorganic insulating layer 13A is formed in the organic insulating layer 13B. The opening 13Bp is disposed to overlap the drain electrode DE when viewed from the normal direction of the substrate 1.

Step 8: Formation of Common Electrode CE (FIG. 9J)

Figure 9J:
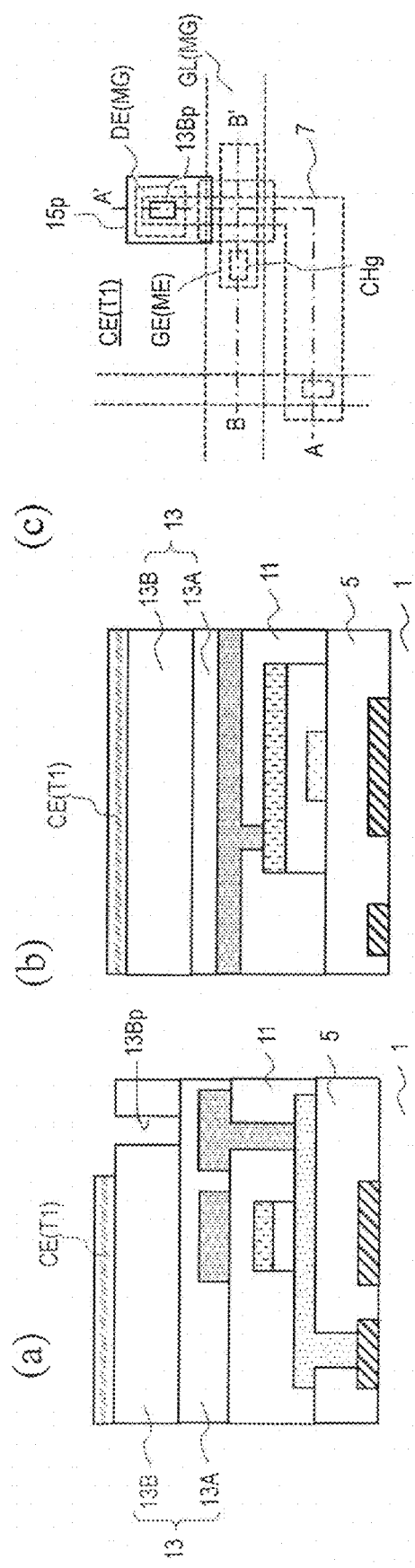
FIG. 9J is a diagram illustrating the manufacturing method of the active matrix substrate 100, and (a) and (b) thereof are process cross-sectional views and (c) thereof is a process plan view.

Subsequently, as illustrated in FIG. 9J, the common electrode CE is formed on the upper insulating layer 13.

First, the first transparent conductive film (having a thickness of, 20 to 300 nm) (not illustrated) is formed on the upper insulating layer 13. Here, for example, an indium-zinc oxide film is formed as the first transparent conductive film by sputtering. As a material of the first transparent conductive film, metal oxide such as indium-tin oxide (ITO), indium-zinc oxide, and ZnO can be used. Subsequently, patterning of the first transparent conductive film is performed. In the patterning, for example, wet etching may be performed by using an oxalic acid-based etching solution. In this manner, the common electrode CE is obtained. The common electrode CE has, for example, the opening 15p in a pixel contact portion-formed region in which the pixel contact hole CHp is formed. The common electrode CE may be disposed across substantially the entire display region except the pixel contact portion-formed region.

Step 9: Formation of Dielectric Layer 17 (FIG. 9K)

Figure 9K:
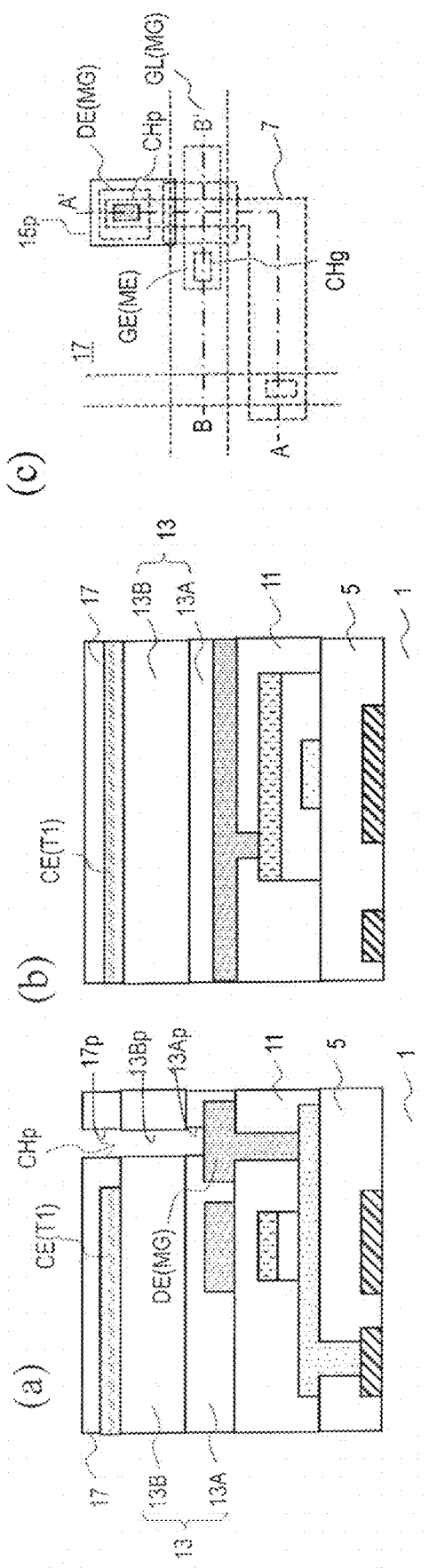
FIG. 9K is a diagram illustrating the manufacturing method of the active matrix substrate 100, and (a) and (b) thereof are process cross-sectional views and (c) thereof is a process plan view.

Subsequently, as illustrated in FIG. 9K, the dielectric layer (having a thickness of, 50 to 500 nm) 17 is formed to cover the common electrode CE.

A material of the dielectric layer 17 may be the same material illustrated as the material of the inorganic insulating layer 13A. Here, as the dielectric layer 17, for example, an SiN film is formed by CVD.

Subsequently, with a known photolithography process, etching of the dielectric layer 17 and the inorganic insulating layer 13A is performed, and openings 17p and 13Ap are thereby formed. It is only necessary that the opening 17p at least partially overlap the openings 13Bp and 13Ap when viewed from the normal direction of the substrate 1. In this manner, the pixel contact hole CHp for exposing a part of the second region 72 of the oxide semiconductor layer 7 is formed in the pixel area. The pixel contact hole CHp includes the opening 13Ap formed in the inorganic insulating layer 13A, the opening 13Bp of the organic insulating layer 13B, and the opening 17p of the dielectric layer 17.

Note that, here, patterning of the inorganic insulating layer 13A is simultaneously performed with the dielectric layer 17. Instead, after the organic insulating layer 13B is formed and before the dielectric layer 17 is formed, patterning of the inorganic insulating layer 13A (formation of the opening 13Ap) may be performed with the organic insulating layer 13B being used as a mask.

Figure 9L:
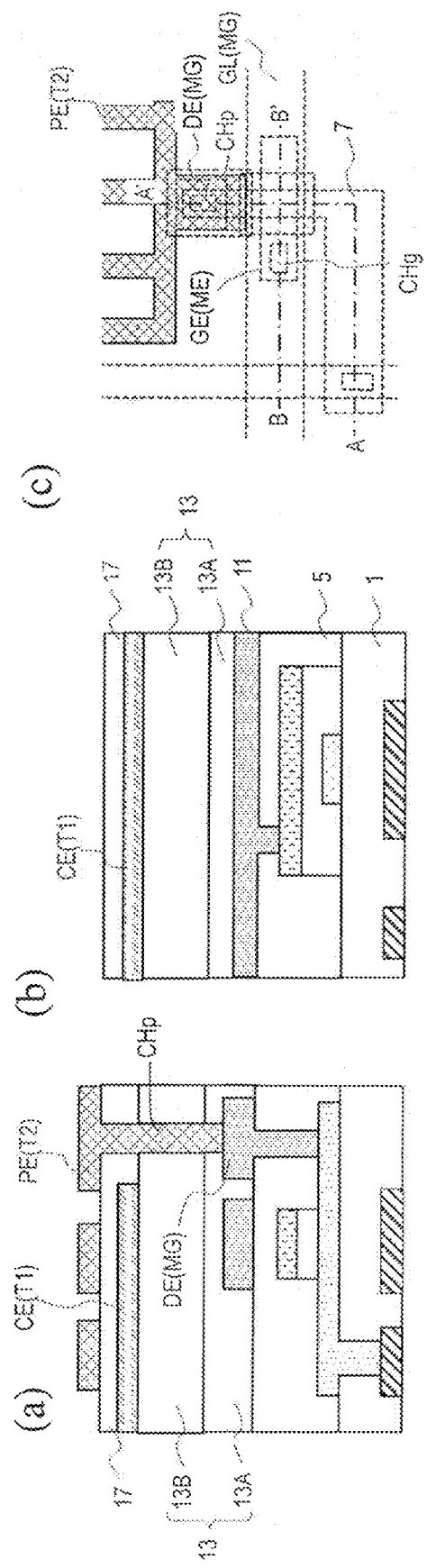
FIG. 9L is a diagram illustrating the manufacturing method of the active matrix substrate 100, and (a) and (b) thereof are process cross-sectional views and (c) thereof is a process plan view.

Step 10: Formation of Pixel Electrode PE (FIG. 9L)

Subsequently, the second transparent conductive film (having a thickness of, 20 to 300 nm) (not illustrated) is formed on the dielectric layer 17 and in the pixel contact hole CHp. A material of the second transparent conductive film may be the same as the material illustrated as the material of the first transparent conductive film.

Subsequently, patterning of the second transparent conductive film is performed. Here, for example, wet etching of the second transparent conductive film is performed by using an oxalic acid-based etching solution. In this manner, as illustrated in FIG. 9L, the pixel electrode PE having a slit (or a notched portion) is formed in each pixel area. The pixel electrode PE is formed on the dielectric layer 17 and in the pixel contact hole CHp, and comes into contact with the drain electrode DE in the pixel contact hole CHp. In this manner, the active matrix substrate 100 is manufactured.

Note that, although the position of the gate contact portion and the shape of the gate electrode may be different, the active matrix substrates 101, 102, and 103 according to the first to third modifications described above may also be manufactured with a method similar to that of the active matrix substrate 100.

Second Embodiment

In the following, an active matrix substrate according to a second embodiment will be described. The active matrix substrate according to the present embodiment is different from that of the embodiment described above in that the oxide semiconductor layer 7 and the source electrode SE (source bus line SL) are electrically connected via a connection electrode formed in the gate electrode layer ME in the source contact portion.

Figure 10A:
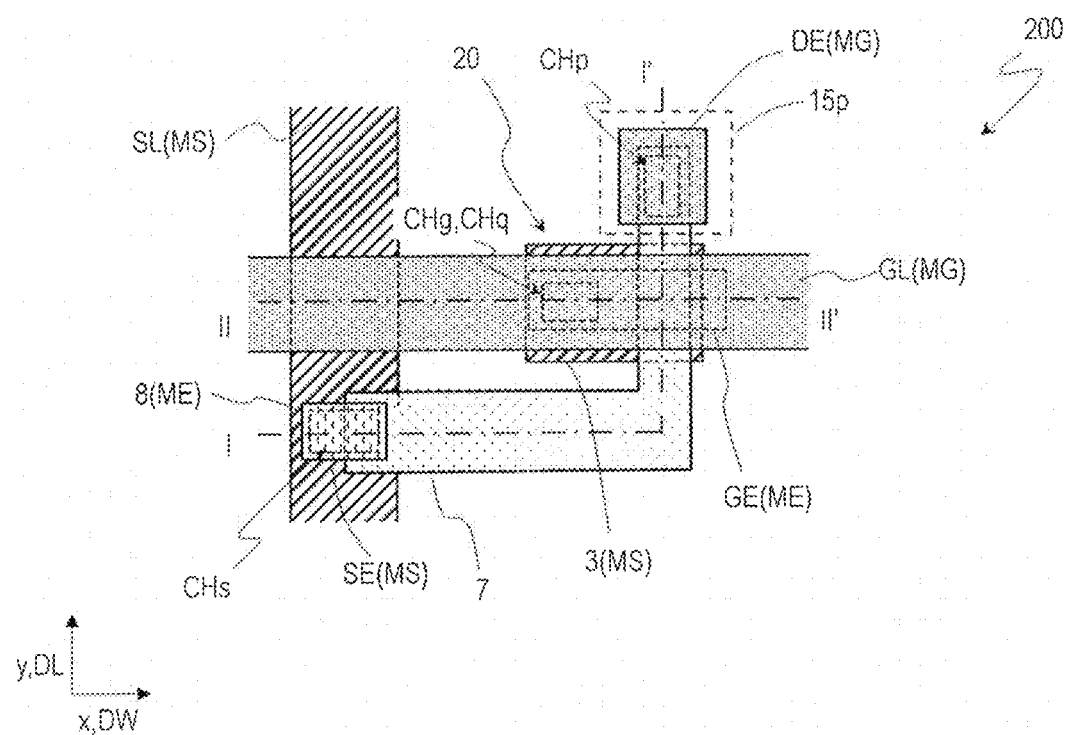
FIG. 10A is a plan view illustrating the pixel area in an active matrix substrate 200 according to the second embodiment.
Figure 10B:
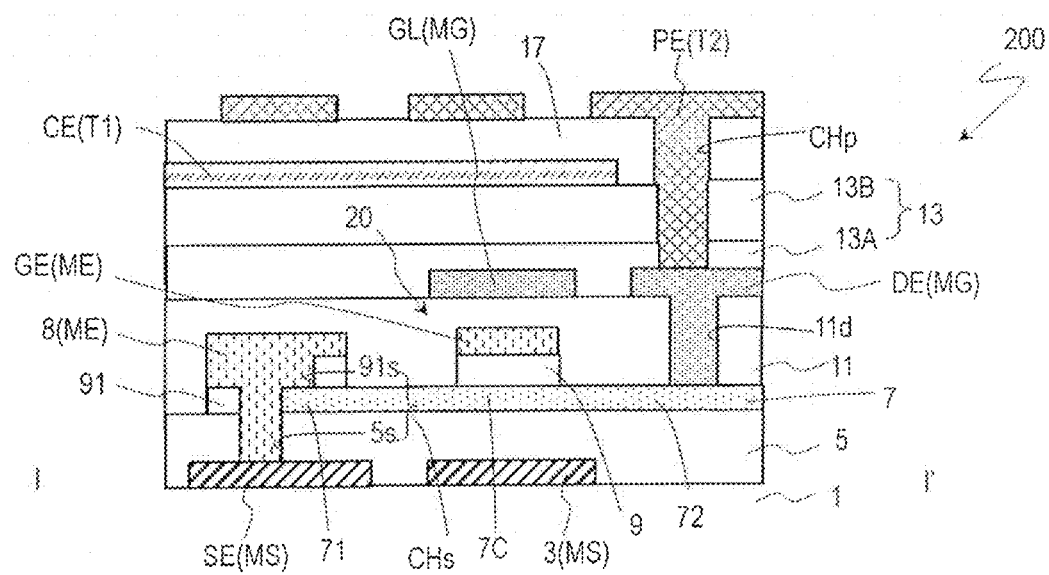
FIG. 10B is a cross-sectional view taken along the line I-I' illustrated in FIG. 10A in the active matrix substrate 200.
Figure 10C:
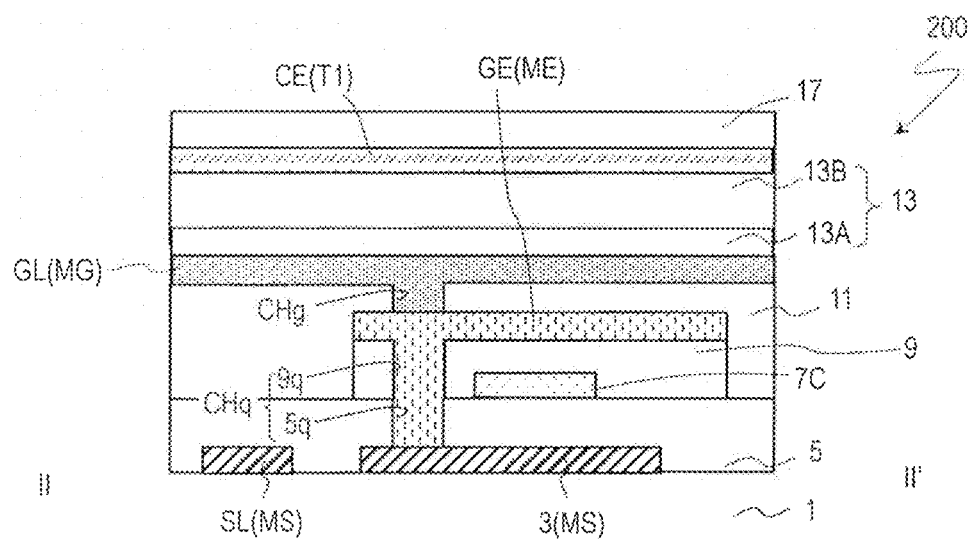
FIG. 10C is a cross-sectional view taken along the line II-II' illustrated in FIG. 10A in the active matrix substrate 200.

FIG. 10A is a plan view illustrating each pixel area P in an active matrix substrate 200 according to the second embodiment. FIG. 10B is a cross-sectional view taken along the line I-I' illustrated in FIG. 10A. FIG. 10C is a cross-sectional view taken along the line II-II' illustrated in FIG. 10A. Constituent elements similar to those of FIG. 2A to FIG. 2C are denoted by the same reference signs and description thereof will be omitted. Although the active matrix substrate 100 includes a plurality of pixel areas P, a single pixel area P will be described below.

A pixel TFT (TFT) 20 according to the present embodiment is an oxide semiconductor TFT having a double gate structure. The TFT 20 includes an oxide semiconductor layer 7, a gate electrode (also referred to as an "upper gate electrode") GE disposed above the oxide semiconductor layer 7, a lower conductive part 3 disposed between the oxide semiconductor layer 7 and the substrate 1, and a source electrode SE and a drain electrode DE. The gate electrode GE is disposed on a part of the oxide semiconductor layer 7 with the gate insulating layer 9 being interposed therebetween. The lower conductive part 3 is disposed on the substrate 1 side of the oxide semiconductor layer 7 with the lower insulating layer 5 being interposed therebetween. The lower conductive part 3 is electrically connected to the gate electrode GE and the gate bus line GL, and functions as a gate electrode of the TFT 20 (also referred to as a "lower gate electrode").

In the present embodiment, the TFT 20 further includes a connection electrode 8. The connection electrode 8 is an island-shape electrode that is formed by using the same conductive film as the gate electrode GE (specifically, in the gate electrode layer ME). The connection electrode 8 electrically connects first region 71 of the oxide semiconductor layer 7 and the source electrode SE (or the source bus line SL) in the source contact portion. The connection electrode 8 may be disposed to cross an end portion of the oxide semiconductor layer 7 in a part above the source bus line SL when viewed from the normal direction of the substrate 1, for example. A first insulating layer 91 formed with the same insulating film as the gate insulating layer 9 (specifically, formed in the same layer as the gate insulating layer 9) is disposed between the connection electrode 8 and the lower insulating layer 5. The first insulating layer 91 has an island-shape shape, and when viewed from the normal direction of the substrate 1, a peripheral edge of the first insulating layer 91 and a peripheral edge of the connection electrode 8 are aligned with each other.

In the lower insulating layer 5 and the first insulating layer 91, a source contact hole CHs for exposing a part of the source bus line SL and a part of the oxide semiconductor layer 7 (second region 72) is formed. The source contact hole CHs includes a source opening 5s formed in the lower insulating layer 5 and a first opening 91s formed in the first insulating layer 91. The source opening 5s and the first opening 91s at least partially overlap each other when viewed from the normal direction of the substrate 1. As illustrated in the drawings, a part of the side surface of the first opening 91s is located on the oxide semiconductor layer 7, and not only the end face of the oxide semiconductor layer 7 but also a part of the upper face of the oxide semiconductor layer 7 may be exposed in the source contact hole CHs. The connection electrode 8 is disposed on the first insulating layer 91 and in the source contact hole CHs, and is electrically connected to both of the source electrode SE (or the source bus line SL) and the oxide semiconductor layer 7 in the source contact hole CHs. The connection electrode 8 may come into direct contact with the exposed part of the source electrode SE and the exposed part of the oxide semiconductor layer 7 in the source contact hole CHs.

The lower conductive part 3 is formed in the source metal layer MS. The lower conductive part 3 is an island-shape electrode that is disposed to overlap at least the channel region 7C of the oxide semiconductor layer 7 when viewed from the normal direction of the substrate 1. The lower conductive part 3 is electrically connected to the gate electrode GE (or the gate bus line GL) in the gate connecting part. In the present example, in the gate connecting part, a lower gate contact hole CHq for exposing a part of the lower conductive part 3 is formed in the lower insulating layer 5 and the gate insulating layer 9. The gate electrode GE is electrically connected to the lower conductive part 3 in the lower gate contact hole CHq. The gate electrode GE may come into direct contact with the exposed part of the lower conductive part 3.

Note that, in the example illustrated in the drawings, when viewed from the normal direction of the substrate 1, the lower gate contact hole CHq and the gate contact hole CHg overlap each other. However, these contact holes need not overlap each other.

The lower gate contact hole CHq includes an opening 5q formed in the lower insulating layer 5 and an opening 9q formed in the gate insulating layer 9. In the present embodiment, the side surfaces of the opening 5q and the opening 9q are aligned with each other. Such a configuration may be formed by performing etching of the lower insulating layer 5 and the gate insulating layer 9 by using the same mask.

As will be described later, in the present embodiment, the source contact hole CHs of the source contact portion and the lower gate contact hole CHq of the gate connecting part can be simultaneously formed through the same etching process for the lower insulating layer 5 and the gate insulating layer 9.

Fourth Modification

Figure 11A:
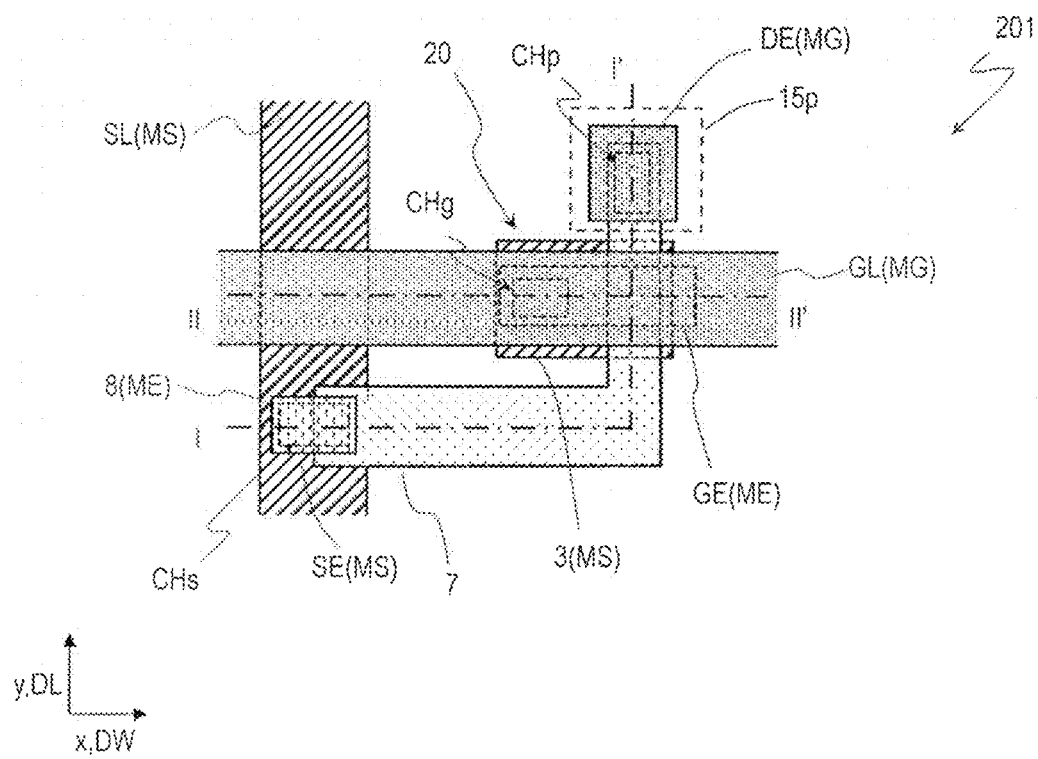
FIG. 11A is a plan view illustrating the pixel area in an active matrix substrate 201 according to the fourth modification.
Figure 11B:
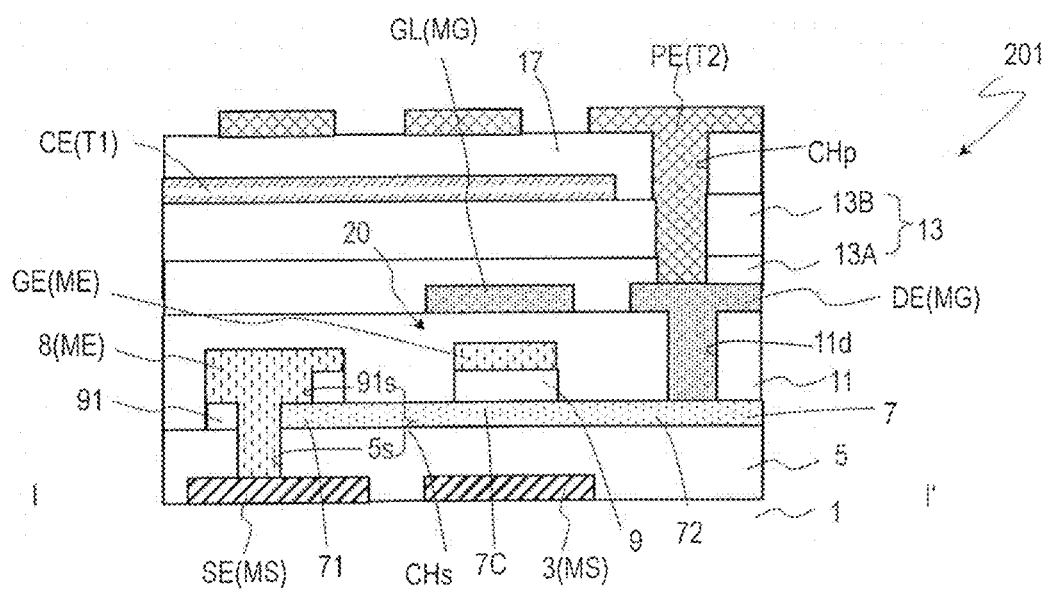
FIG. 11B is a cross-sectional view taken along the line I-I' illustrated in FIG. 11A in the active matrix substrate 201.
Figure 11C:
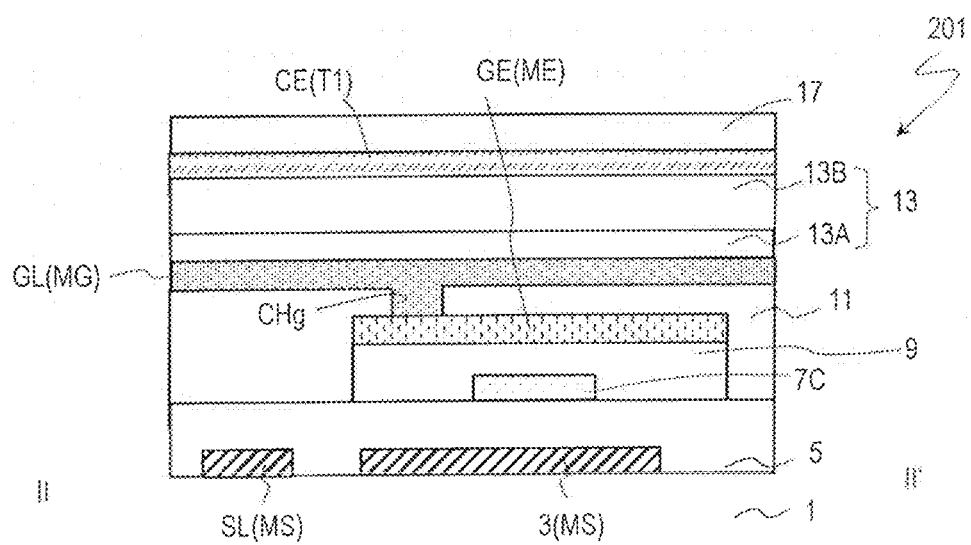
FIG. 11C is a cross-sectional view taken along the line II-II' illustrated in FIG. 11A in the active matrix substrate 201.

FIG. 11A is a plan view illustrating each pixel area P in an active matrix substrate 201 according to the fourth modification. FIG. 11B is a cross-sectional view taken along the line I-I' illustrated in FIG. 11A. FIG. 11C is a cross-sectional view taken along the line II-II' illustrated in FIG. 11A. Constituent elements similar to those of FIG. 2A to FIG. 2C are denoted by the same reference signs and description thereof will be omitted.

The active matrix substrate 201 according to the fourth modification is different from the active matrix substrate 200 in that the TFT 20 is a top gate TFT having a single gate structure.

In the active matrix substrate 201, the gate connecting part is not provided, and the gate bus line GL and the gate electrode GE are electrically separated from each other in the lower conductive part 3. Thus, the lower conductive part 3 does not function as the lower gate electrode of the TFT 20. The lower conductive part 3 functions as the light blocking layer of the TFT 20, in a manner similar to the active matrix substrate 100 or the like.

Manufacturing Method of Active Matrix Substrate

Next, a manufacturing method of the active matrix substrate according to the present embodiment will be described with reference to the drawings. Here, a manufacturing method of the active matrix substrate 200 will be described as an example.

FIGS. 12A to 12G are each a schematic view for describing the manufacturing method of the active matrix substrate 200. (a) and (b) of each diagram are process cross-sectional views, and (c) of each diagram is a process plan view. (a) and (b) of each diagram are process cross-sectional views taken along the line A-A' and the line B-B' of (c) of each diagram, respectively. The following will describe a manufacturing method of one unit region out of a plurality of unit regions in the active matrix substrate 200. Further, description of the material, thickness, formation process, and the like of each layer will be omitted if those are similar to those of the active matrix substrate 100.

Steps 1 to 3: Formation of Source Metal Layer MS, Lower Insulating Layer 5, and Oxide Semiconductor Layer 7

The source metal layer MS including the source bus line SL, the source electrode SE, and the lower conductive part 3 is formed on the substrate 1. Subsequently, the lower insulating layer 5 is formed to cover the source metal layer MS. In the present process, patterning for forming the source opening 5s in the lower insulating layer 5 is not performed.

Figure 12A:
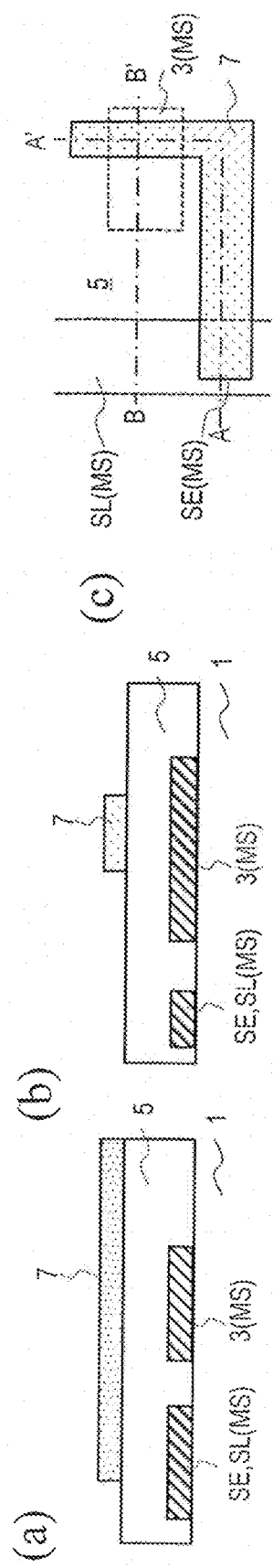
FIG. 12A is a diagram illustrating a manufacturing method of the active matrix substrate 200, and (a) and (b) thereof are process cross-sectional views and (c) thereof is a process plan view.

Subsequently, an oxide semiconductor film is formed on the lower insulating layer 5, and patterning of the oxide semiconductor film is performed. In this manner, as illustrated in FIG. 12A, the oxide semiconductor layer 7 to be an active layer of the TFT 10 is obtained.

Step 4: Formation of Gate Insulating Layer 9 and Gate Electrode GE (FIGS. 12B to 12E)

Figure 12B:
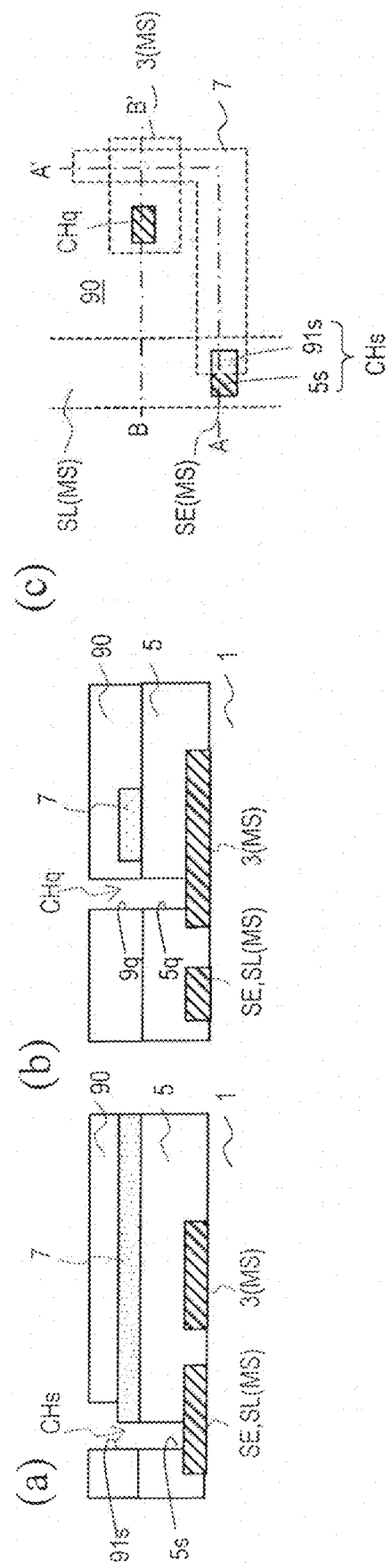
FIG. 12B is a diagram illustrating the manufacturing method of the active matrix substrate 200, and (a) and (b) thereof are process cross-sectional views and (c) thereof is a process plan view.

Subsequently, the gate insulating film 90 is formed to cover the oxide semiconductor layer 7. Subsequently, patterning (dry etching) of the gate insulating film 90 and the lower insulating layer 5 is performed with a known photolithography process. In this manner, as illustrated in FIG. 12B, the source contact hole CHs for exposing a part of the source electrode SE and a part of the oxide semiconductor layer 7 (for example, an end portion of the oxide semiconductor layer 7) is formed in the source contact portion, and the lower gate contact hole CHq for exposing a part of the lower conductive part 3 is formed in the gate connecting part.

The source contact hole CHs includes the source opening 5s of the lower insulating layer 5 and the first opening 91s of the gate insulating film 90.

The lower gate contact hole CHq includes the opening 5q of the lower insulating layer 5 and the opening 9q of the gate insulating film 90. The lower gate contact hole CHq is disposed to be spaced apart from the oxide semiconductor layer 7 so as not to come into contact with the oxide semiconductor layer 7. The lower gate contact hole CHq may be disposed to at least partially overlap the gate contact hole CHg of the gate contact portion to be formed later. In this manner, the area of the gate electrode GE and the lower conductive part 3 need not be increased for the purpose of forming the gate connecting part, and thus increase of the pixel aperture ratio can be prevented.

Figure 12C:
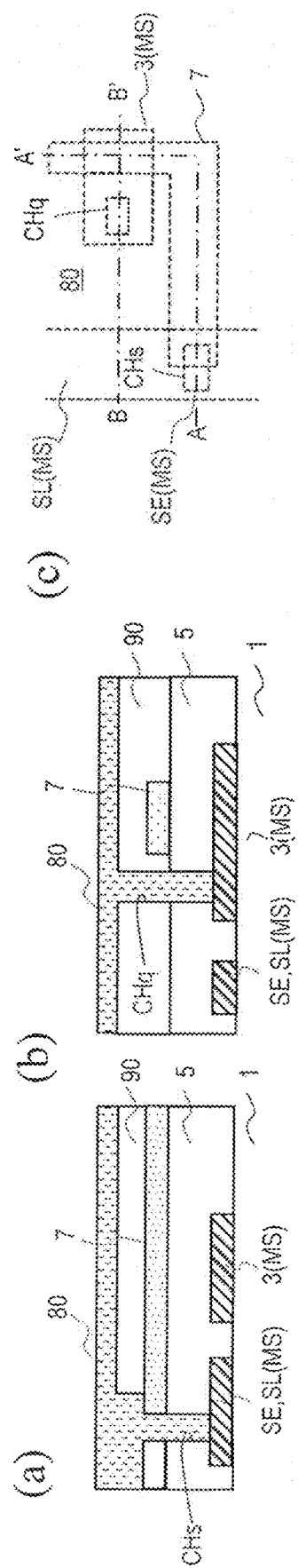
FIG. 12C is a diagram illustrating the manufacturing method of the active matrix substrate 200, and (a) and (b) thereof are process cross-sectional views and (c) thereof is a process plan view.

Subsequently, as illustrated in FIG. 12C, the gate electrode film 80 is formed on the gate insulating film 90 and in the first opening 91s and the opening 9q.

Figure 12D:
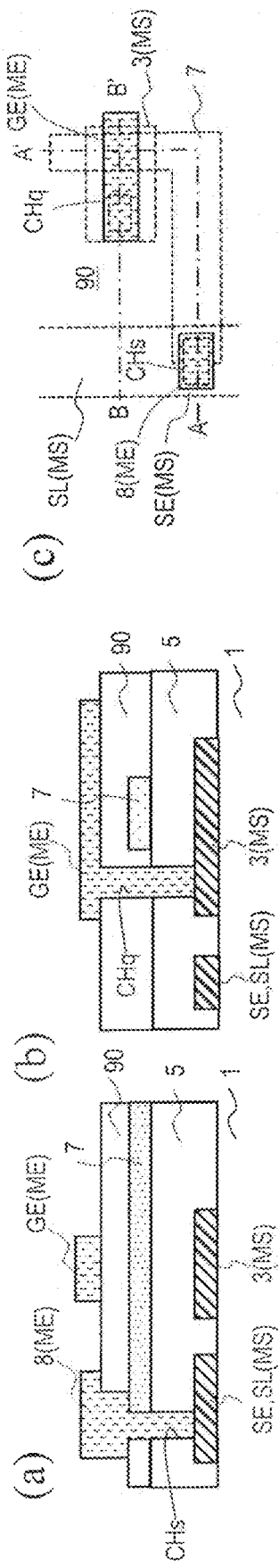
FIG. 12D is a diagram illustrating the manufacturing method of the active matrix substrate 200, and (a) and (b) thereof are process cross-sectional views and (c) thereof is a process plan view.

Subsequently, as illustrated in FIG. 12D, patterning (for example, wet etching) of the gate electrode film 80 is performed with a known photolithography process, and the gate electrode layer ME including the gate electrode GE and the connection electrode 8 is thereby formed. The gate electrode GE is connected to the lower conductive part 3 in the lower gate contact hole CHq. The gate electrode GE may come into direct contact with the exposed surface of the lower conductive part 3. The connection electrode 8 is connected to the second region 72 of the oxide semiconductor layer 7 and the source electrode SE in the source contact hole CHs. The connection electrode 8 may come into direct contact with the second region 72 and the exposed surface of the source electrode SE.

Figure 12E:
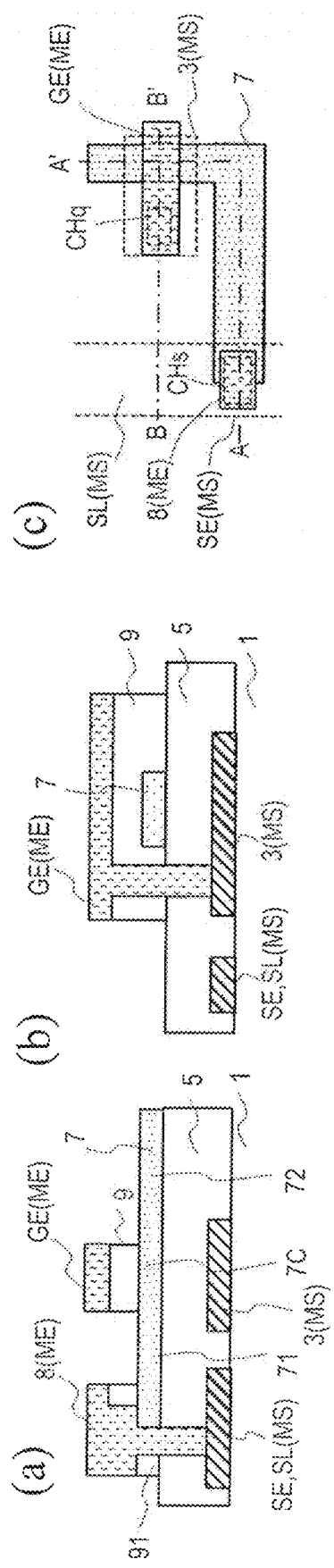
FIG. 12E is a diagram illustrating the manufacturing method of the active matrix substrate 200, and (a) and (b) thereof are process cross-sectional views and (c) thereof is a process plan view.

Subsequently, the gate insulating film 90 is further patterned by using the same resist mask as that in the patterning of the gate electrode film 80 (for example, dry etching). In this manner, as illustrated in FIG. 12E, the gate insulating layer 9 is formed below the gate electrode GE, and the first insulating layer 91 is formed below the connection electrode 8. When viewed from the normal direction of the substrate 1, the side surface of the gate electrode GE and the side surface of the gate insulating layer 9 are aligned with each other. Further, the side surface of the connection electrode 8 and the side surface of the first insulating layer 91 are aligned with each other.

Instead of the method, the resist mask may be removed after the patterning of the gate electrode film 80, and patterning of the gate insulating film 90 may be performed, with the patterned gate electrode film (gate electrode layer ME) being used as a mask.

Through the present process, of the oxide semiconductor layer 7, when viewed from the normal direction of the substrate 1, the region 7C overlapping the gate electrode GE is formed into the "channel region", and the regions located on both the sides of the region are formed into the first region 71 and the second region 72.

Figure 12F:
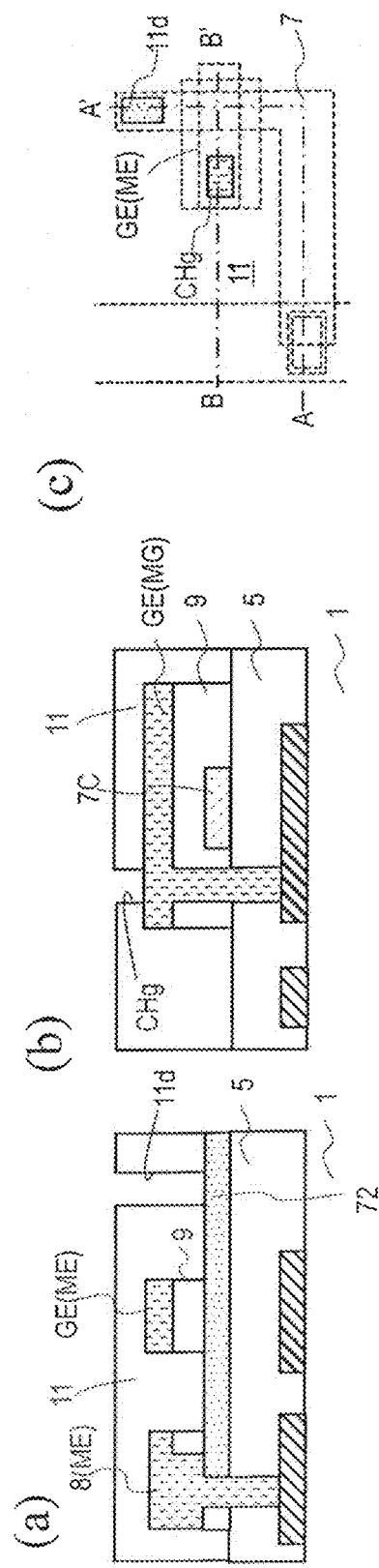
FIG. 12F is a diagram illustrating the manufacturing method of the active matrix substrate 200, and (a) and (b) thereof are process cross-sectional views and (c) thereof is a process plan view.

Step 5: Formation of Interlayer Insulating Layer 11 (FIG. 12F)

Subsequently, the interlayer insulating layer 11 that covers the oxide semiconductor layer 7, the gate insulating layer 9, the connection electrode 8, and the gate electrode GE is formed. Subsequently, for example, the drain opening 11d for exposing a part of the second region 72 of the oxide semiconductor layer 7 and the gate contact hole CHg for exposing a part of the gate electrode GE are formed in the interlayer insulating layer 11 by dry etching.

Figure 12G:
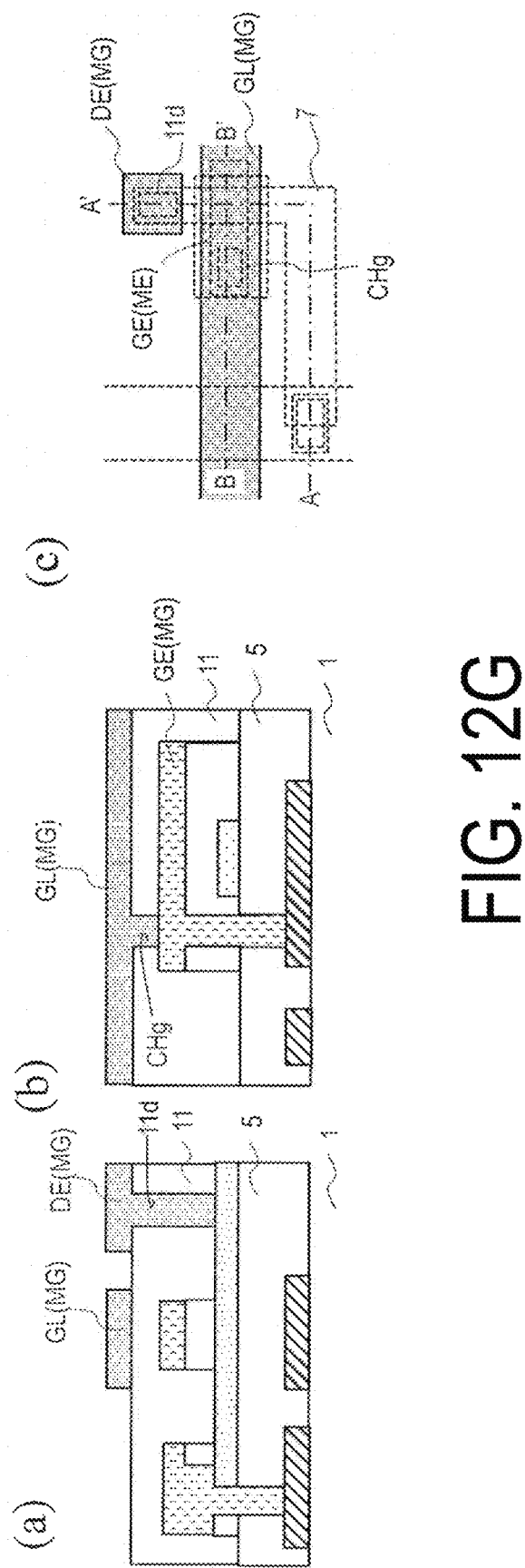
FIG. 12G is a diagram illustrating the manufacturing method of the active matrix substrate 200, and (a) and (b) thereof are process cross-sectional views and (c) thereof is a process plan view.

Step 6: Formation of Gate Metal Layer MG (FIG. 12G)

Subsequently, a gate conductive film is formed on the interlayer insulating layer 11, and patterning of the gate conductive film is performed. In this manner, as illustrated in FIG. 12G, the gate metal layer MG including the gate bus line GL and the drain electrode DE is formed.

Steps 7 to 9: Formation of Upper Insulating Layer 13, Common Electrode CE, Dielectric Layer 17, and Pixel Electrode PE Subsequently, although not illustrated, the upper insulating layer 13, the common electrode CE, the dielectric layer 17, and the pixel electrode PE are formed with a method similar to that of the active matrix substrate 100. In this manner, the active matrix substrate 200 is manufactured.

Note that the active matrix substrate 201 according to the fourth modification described above may also be manufactured with a method similar to that of the active matrix substrate 200, except that the gate connecting part is not provided (that the openings 9q and 11q are not formed).

Fifth Modification

Figure 13A:
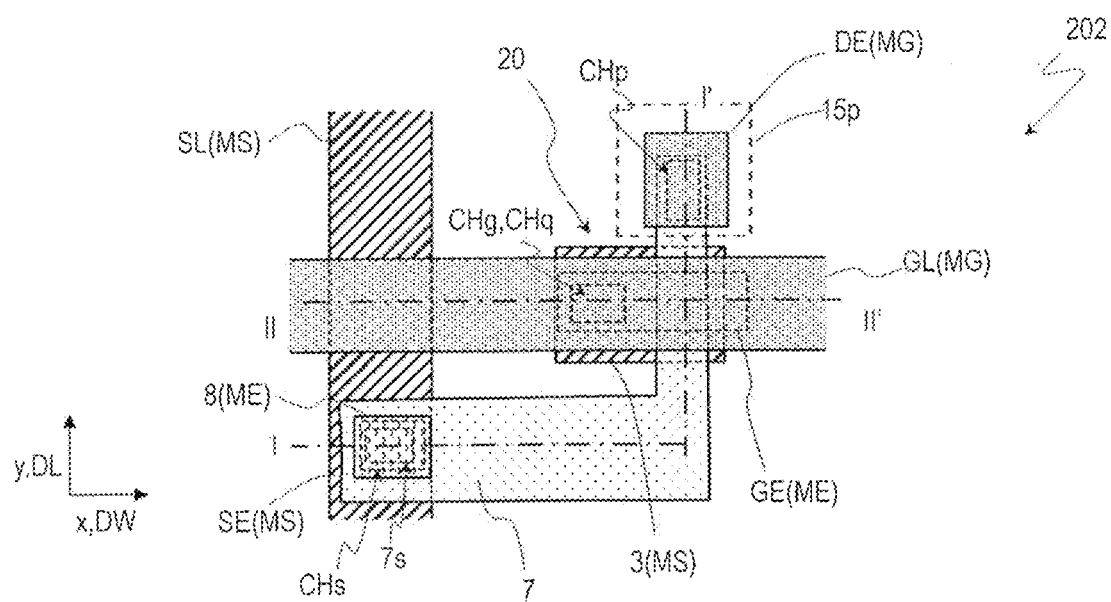
FIG. 13A is a plan view illustrating the pixel area in an active matrix substrate 202 according to the fifth modification.
Figure 13B:
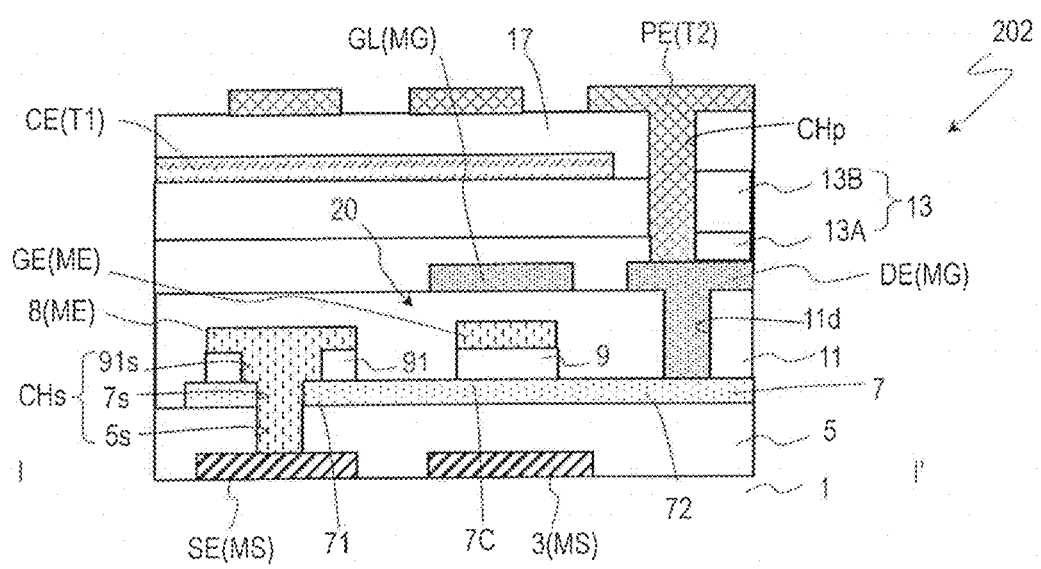
FIG. 13B is a cross-sectional view taken along the line I-I' illustrated in FIG. 13A in the active matrix substrate 202.
Figure 13C:
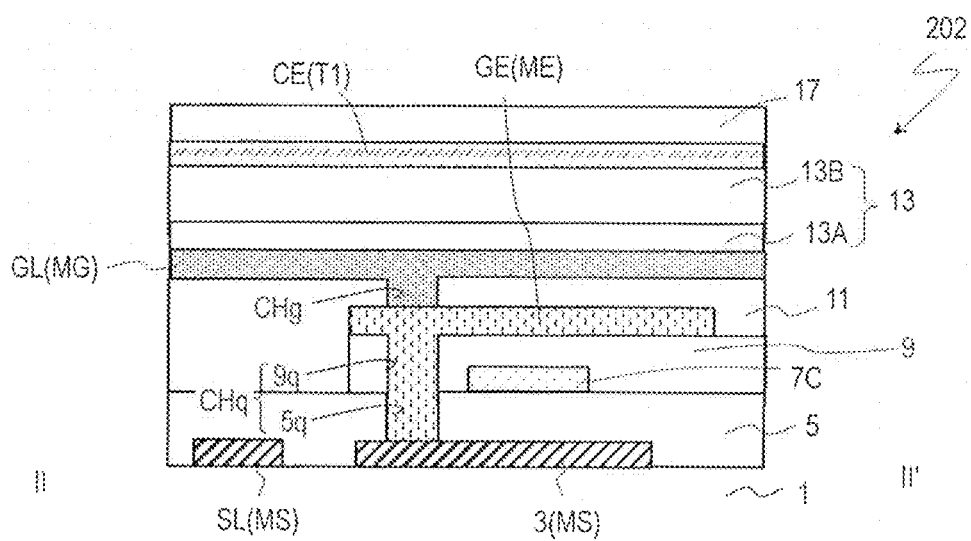
FIG. 13C is a cross-sectional view taken along the line II-II' illustrated in FIG. 13A in the active matrix substrate 202.

FIG. 13A is a plan view illustrating each pixel area P in an active matrix substrate 202 according to the fifth modification. FIG. 13B is a cross-sectional view taken along the line I-I' illustrated in FIG. 13A. FIG. 13C is a cross-sectional view taken along the line II-II' illustrated in FIG. 13A. Constituent elements similar to those of FIG. 2A to FIG. 2C are denoted by the same reference signs and description thereof will be omitted.

The active matrix substrate 202 according to the fifth modification is different from the active matrix substrate 200 in that an opening 7s is formed in the first region 71 of the oxide semiconductor layer 7 in the source contact portion. Note that, instead of providing the opening 7s in the oxide semiconductor layer 7, a notched portion may be provided.

In the active matrix substrate 202, the opening 7s (or the notched portion) of the oxide semiconductor layer 7 is disposed to at least partially overlap the source opening 5s of the lower insulating layer 5 and the first opening 91s of the first insulating layer 91 when viewed from the normal direction of the substrate 1. The source contact hole CHs includes the source opening 5s, the first opening 91s, and the opening 7s (or the notched portion) of the oxide semiconductor layer 7. The connection electrode 8 is electrically connected to the oxide semiconductor layer 7 and the source electrode SE (or the source bus line SL) in the source contact hole CHs.

According to the present modification, even when misalignment occurs, the contact area between the connection electrode 8 and the oxide semiconductor layer 7 can be maintained.

FIGS. 14A to 14D are each a schematic view for describing an example of a manufacturing method of the active matrix substrate 202 according to the fifth modification. (a) and (b) of each diagram are process cross-sectional views, and (c) of each diagram is a process plan view. (a) and (b) of each diagram are process cross-sectional views taken along the line A-A' and the line B-B' of (c) of each diagram, respectively. First, in a manner similar to the active matrix substrate 200, the source metal layer MS and the lower insulating layer 5 are formed on the substrate 1.

Figure 14A:
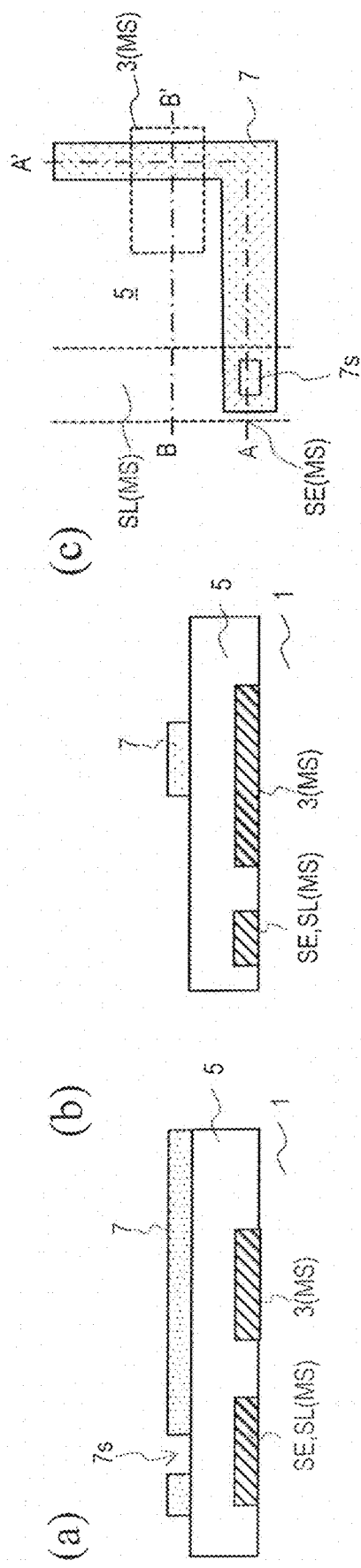
FIG. 14A is a diagram illustrating a manufacturing method of the active matrix substrate 202, and (a) and (b) thereof are process cross-sectional views and (c) thereof is a process plan view.

Subsequently, as illustrated in FIG. 14A, the oxide semiconductor layer 7 including the opening 7s is formed.

Figure 14B:
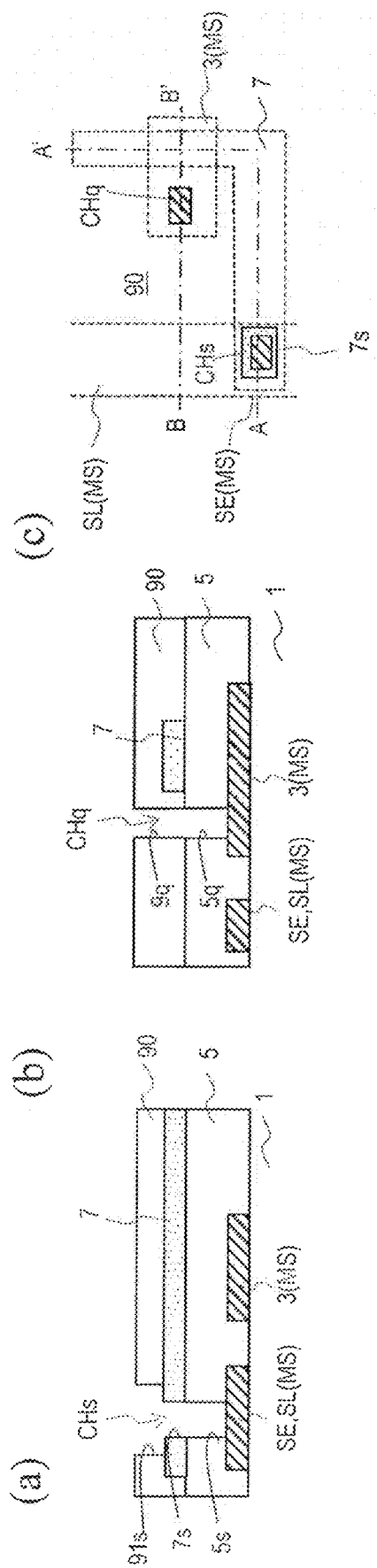
FIG. 14B is a diagram illustrating the manufacturing method of the active matrix substrate 202, and (a) and (b) thereof are process cross-sectional views and (c) thereof is a process plan view.

Subsequently, the gate insulating film 90 is formed to cover the oxide semiconductor layer 7. Subsequently, patterning of the gate insulating film 90 and the lower insulating layer 5 is performed, with the resist layer (not illustrated) formed on the gate insulating film 90 being used as a mask. The lower insulating layer 5 is etched with the resist layer on the gate insulating film 90 and the oxide semiconductor layer 7 being used as a mask. In this manner, as illustrated in FIG. 14B, the source contact hole CHs reaching the source electrode SE and the lower gate contact hole CHq reaching the lower conductive part 3 are obtained.

The source contact hole CHs includes the first opening 91s formed in the gate insulating film 90, the source opening 5s formed in the lower insulating layer 5, and the opening 7s of the oxide semiconductor layer 7. For example, the first opening 91s may have a size larger than the size of the opening 7s, and may be formed to expose the entire opening 7s. In this manner, when viewed from the normal direction of the substrate 1, the opening 7s is located in the first opening 91s. In other words, the side surface of the first opening 91s is located on the oxide semiconductor layer 7. In this case, because the lower insulating layer 5 is etched with the oxide semiconductor layer 7 being used as a mask, the side surface of the source opening 5s formed in the lower insulating layer 5 is aligned with the side surface of the opening 7s.

Figure 14C:
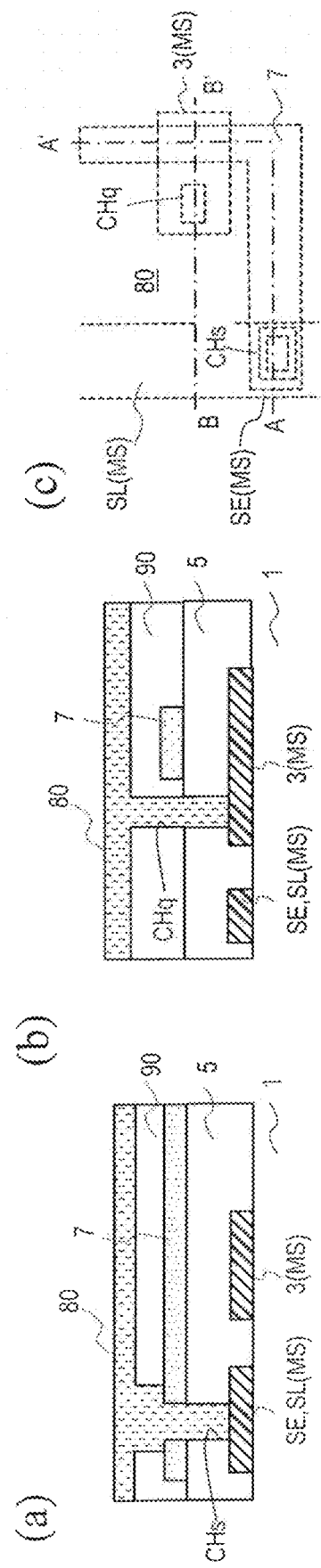
FIG. 14C is a diagram illustrating the manufacturing method of the active matrix substrate 202, and (a) and (b) thereof are process cross-sectional views and (c) thereof is a process plan view.

Subsequently, as illustrated in FIG. 14C, the gate electrode film 80 is formed on the gate insulating film 90, in the source contact hole CHs, and in the lower gate contact hole CHq.

Figure 14D:
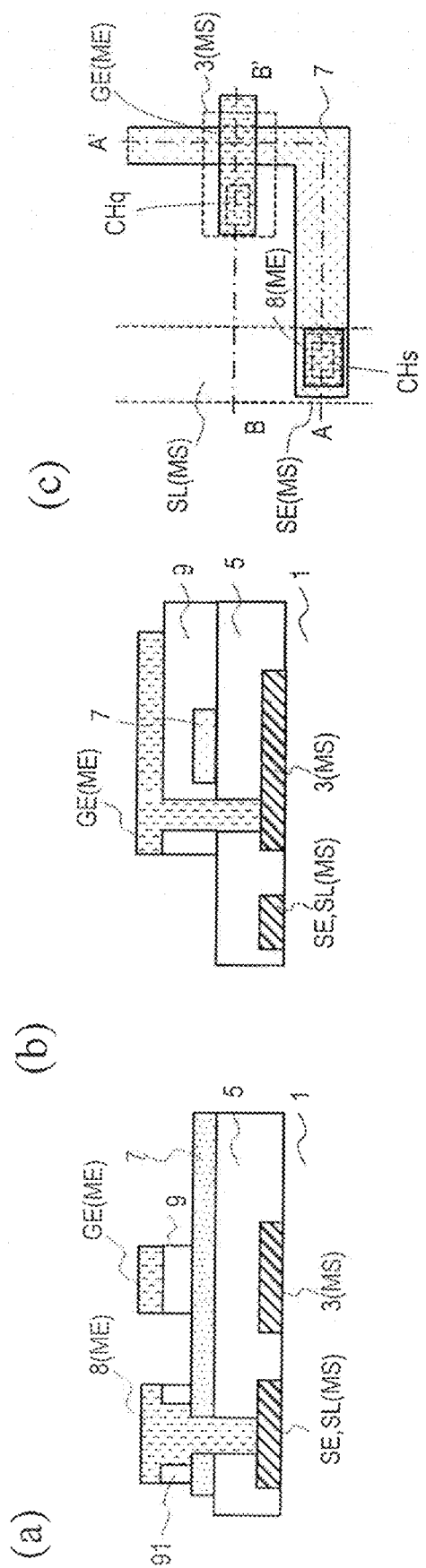
FIG. 14D is a diagram illustrating the manufacturing method of the active matrix substrate 202, and (a) and (b) thereof are process cross-sectional views and (c) thereof is a process plan view.

Next, as illustrated in FIG. 14D, patterning of the gate electrode film 80 and the gate insulating film 90 is performed. In this manner, the connection electrode 8 and the gate electrode GE are formed from the gate electrode film 80, and the first insulating layer 91 and the gate insulating layer 9 are formed from the gate insulating film 90. The subsequent process is similar to that of the manufacturing method of the active matrix substrate 200.

Other Active Matrix Substrate

The structure of the active matrix substrate according to the disclosure of the present application is not limited to the structure illustrated in the first and second embodiments. In the embodiments described above, the gate bus line and the drain electrode of the pixel TFT are formed by using the same conductive film (in the same layer). However, these may be formed in different conductive layers (in different layers). Alternatively, the pixel TFT need not include the drain electrode.

Figure 15A:
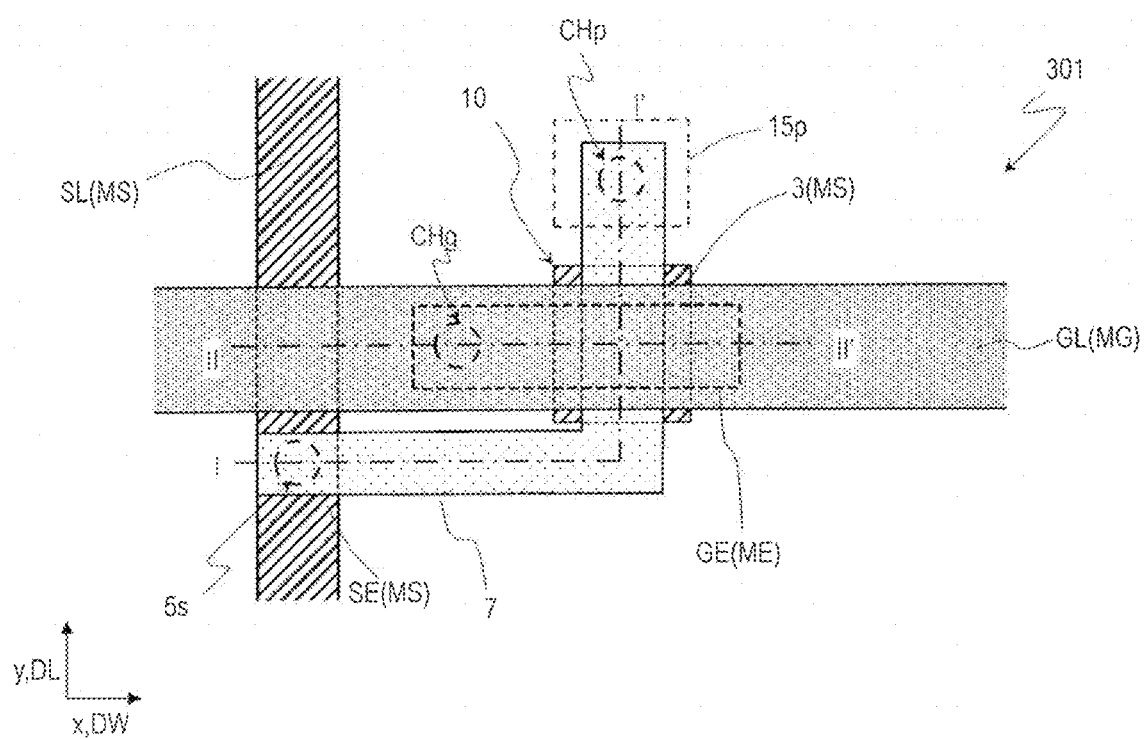
FIG. 15A is a plan view illustrating the pixel area in another active matrix substrate 301.
Figure 15B:
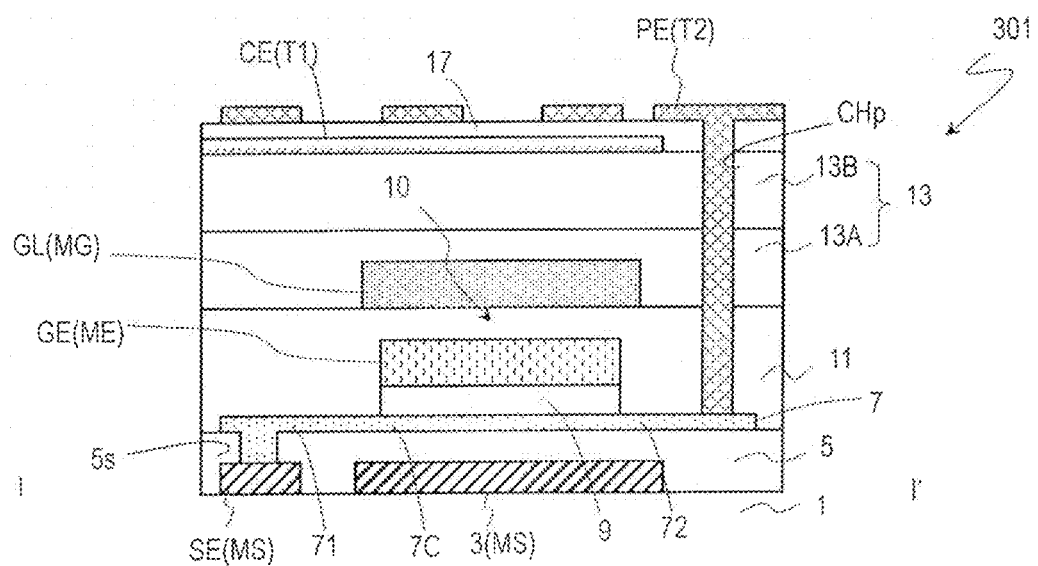
FIG. 15B is a cross-sectional view taken along the line I-I' illustrated in FIG. 15A in the active matrix substrate 301.
Figure 15C:
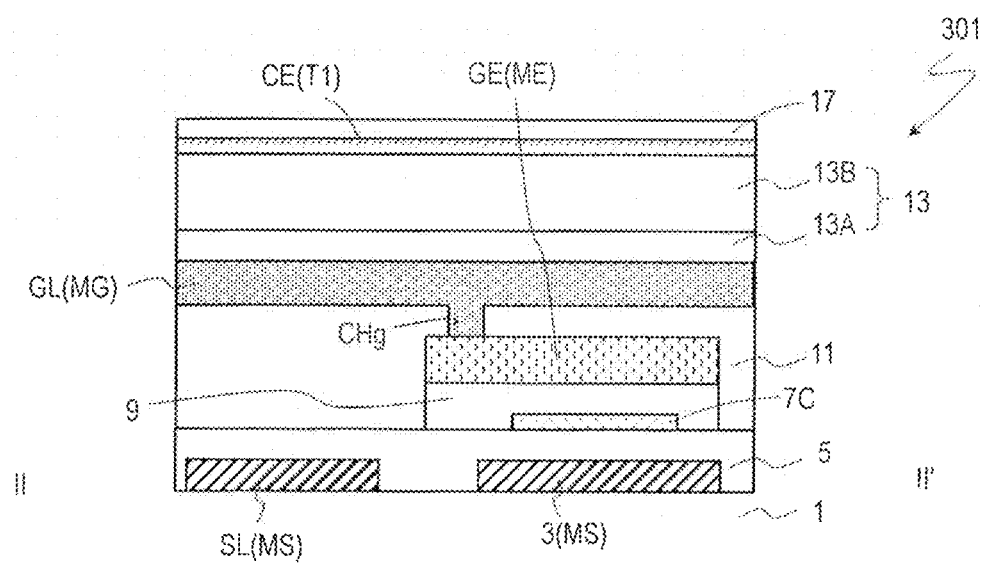
FIG. 15C is a cross-sectional view taken along the line II-II' illustrated in FIG. 15A in the active matrix substrate 301.

FIG. 15A is a plan view illustrating each pixel area P in another active matrix substrate 301. FIG. 15B is a cross-sectional view taken along the line I-I' illustrated in FIG. 15A. FIG. 15C is a cross-sectional view taken along the line II-II' illustrated in FIG. 15A. Constituent elements similar to those of FIG. 2A to FIG. 2C are denoted by the same reference signs and description thereof will be omitted.

The active matrix substrate 301 is different from the active matrix substrate 100 in that, in each pixel area, the pixel TFT includes the drain electrode DE, and the oxide semiconductor layer 7 of the pixel TFT comes into direct contact with the pixel electrode PE.

In the active matrix substrate 301, the pixel electrode PE comes into direct contact with the second region 72 of the oxide semiconductor layer 7 in the pixel contact hole CHp formed in the dielectric layer 17, the upper insulating layer 13, and the interlayer insulating layer 11. By not providing the drain electrode DE, the pixel aperture ratio can be increased. Further, the interval between the gate bus line GL and the pixel contact portion can be reduced.

Although not illustrated, the structure of the pixel contact portion illustrated in the active matrix substrate 301 (the structure in which the drain electrode DE is not provided) may be applied to the active matrix substrates 101 to 103 and 200 to 202, other than the active matrix substrate 100.

The active matrix substrate according to the disclosure of the present application may be applied to a display device (touch panel) including a touch sensor. In the touch panel, a plurality of electrodes (hereinafter "sensor electrodes") for the touch sensor and a plurality of wiring lines for drive and/or detection of the touch sensor (hereinafter collectively referred to as "touch wiring lines") are in some cases provided in the active matrix substrate. Each touch wiring line is electrically connected to a corresponding sensor electrode. The common electrode may serve as the sensor electrode as well. Although not illustrated, in the touch panel, the touch wiring lines and the drain electrode may be formed in a different layer from the gate bus lines.

In addition, in the embodiments described above, the pixel electrode PE is disposed on the common electrode CE with the dielectric layer 17 being interposed therebetween. However, the common electrode CE may be disposed on the pixel electrode PE with the dielectric layer 17 being interposed therebetween. Such an electrode structure is described in, for example, JP 2008-032899 A and JP 2010-008758 A. The entire contents of the disclosure of WO 2012/086513 A, JP 2008-032899 A, and JP 2010-008758 A are incorporated herein by reference.

The active matrix substrates according to the embodiments of the disclosure of the present application can be applied not only to liquid crystal display devices of a transverse electrical field mode such as an FFS mode and an In-Plane Switching (IPS) mode, but can be applied to liquid crystal display devices of a vertical alignment mode (VA mode) as well. Structures of such liquid crystal display devices are well-known, and description thereof will thus be omitted.

Oxide Semiconductor

An oxide semiconductor included in the oxide semiconductor layer 7 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer 7 may have a layered structure including two or more layers. When the oxide semiconductor layer 7 has the layered structure, the oxide semiconductor layer 7 may include an amorphous oxide semiconductor layer and a crystalline oxide semiconductor layer. Alternatively, the oxide semiconductor layer 7 may include a plurality of crystalline oxide semiconductor layers having different crystal structures. In addition, the oxide semiconductor layer 7 may include a plurality of amorphous oxide semiconductor layers. In a case where the oxide semiconductor layer 7 has a dual-layer structure including an upper layer and a lower layer, an energy gap of the oxide semiconductor included in a layer closer to the gate electrode (that is the lower layer in the case of the bottom gate structure, and the upper layer in the case of the top gate structure) of the two layers may be smaller than an energy gap of the oxide semiconductor included in a layer farther from the gate electrode (that is the upper layer in the case of the bottom gate structure, and the lower layer in the case of the top gate structure). However, in a case where a difference in the energy gap between these layers is relatively small, the energy gap of the oxide semiconductor included in the layer closer to the gate electrode may be greater than the energy gap of the oxide semiconductor included in the layer farther from the gate electrode.

Materials, structures, and film formation methods of the amorphous oxide semiconductor and each of the above-described crystalline oxide semiconductors, a configuration of the oxide semiconductor layer having the layered structure, and the like are described in JP 2014-007399 A, for example. The entire contents of the disclosure of JP 2014-007399 A are incorporated herein by reference.

The oxide semiconductor layer 7 may include, for example, at least one metal element selected from In, Ga, and Zn. In the present embodiment, the oxide semiconductor layer 7 includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer 7 can be formed of an oxide semiconductor film including the In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis thereof is aligned substantially perpendicular to the layer surface is preferable as the crystalline In—Ga—Zn—O based semiconductor.

Note that a crystal structure of the crystalline In—Ga—Zn—O based semiconductor is disclosed, for example, in JP 2014-007399 A described above, JP 2012-134475 A, JP 2014-209727 A, and the like. The entire contents of the disclosure of JP 2012-134475 A and JP 2014-209727 A are incorporated herein by reference. A TFT including an In—Ga—Zn—O based oxide semiconductor layer has high mobility (more than 20 times as compared to an a-Si TFT) and a low leakage current (less than 1/100th as compared to the a-Si TFT), and thus such a TFT can be used suitably as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 7 may include another oxide semiconductor. For example, the oxide semiconductor layer 7 may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer 7 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

INDUSTRIAL APPLICABILITY

The active matrix substrate according to the embodiments of the disclosure can be broadly applied to electronic devices, for example, a display device such as a liquid crystal display device, an organic electroluminescence (EL) display device, and an inorganic electroluminescence display device, an imaging device such as an image sensor device, an image input device, and a fingerprint reader.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate including a plurality of pixel areas, the active matrix substrate comprising:
   a substrate;
   a source bus line supported on a main surface of the substrate;
   a lower insulating layer covering the source bus line;
   oxide semiconductor Thin Film Transistors (TFTs) disposed to correspond to each of the plurality of pixel areas; wherein
   the oxide semiconductor TFTs include:
      an oxide semiconductor layer disposed on the lower insulating layer, the oxide semiconductor layer including a channel region, a first region, and a second region, the first region and the second region being located on respective both sides of the channel region;
      a gate insulating layer covering at least the channel region of the oxide semiconductor layer;

a gate electrode disposed on the gate insulating layer, the gate electrode overlapping the channel region;

an interlayer insulating layer covering the oxide semiconductor layer and the gate electrode;

a connection electrode disposed above the oxide semiconductor layer;

a source electrode made from a same conductive film as the source bus line, the source electrode being disposed in a same layer as the source bus line, the source electrode being electrically connected to the first region via the connection electrode; and a drain electrode electrically connected to the second region via a contact hole in the interlayer insulating layer;

the drain electrode is disposed on the interlayer insulating layer;

the connection electrode includes:

a first contact portion overlapping the first region, the first contact portion being in direct contact with the first region; and a second contact portion overlapping the source electrode, the second contact portion being in direct contact with the source electrode; and when viewed from a normal direction of the main surface of the substrate, the second contact portion more distant from the gate electrode than an end portion of the first region of the oxide semiconductor layer, and is located outside the oxide semiconductor layer.

2. The active matrix substrate according to claim 1, wherein the connection electrode is provided in a same layer as the gate electrode.

3. The active matrix substrate according to claim 1, wherein the second contact portion does not overlap the oxide semiconductor layer.

4. The active matrix substrate according to claim 1, wherein an end portion of the connection electrode that is closer to the gate electrode is disposed on an insulating layer on the oxide semiconductor layer.

5. The active matrix substrate according to claim 4, wherein the insulating layer is a first insulating layer made with the same material as the gate insulating layer.

6. An active matrix substrate including a plurality of pixel areas, the active matrix substrate comprising:

a substrate;

a source bus line supported on a main surface of the substrate;

a lower insulating layer covering the source bus line;

oxide semiconductor Thin Film Transistors (TFTs) disposed to correspond to each of the plurality of pixel areas; wherein the oxide semiconductor TFTs include:

an oxide semiconductor layer disposed on the lower insulating layer, the oxide semiconductor layer including a channel region, a first region, and a second region, the first region and the second region being located on respective both sides of the channel region;

a gate insulating layer covering at least the channel region of the oxide semiconductor layer;

a gate electrode disposed on the gate insulating layer, the gate electrode overlapping the channel region;

an interlayer insulating layer covering the oxide semiconductor layer and the gate electrode;

a connection electrode disposed above the oxide semiconductor layer;

a source electrode made from a same conductive film as the source bus line, the source electrode being disposed in a same layer as the source bus line, the source electrode being electrically connected to the first region via the connection electrode; and a drain electrode electrically connected to the second region via a contact hole in the interlayer insulating layer;

the drain electrode is disposed on the interlayer insulating layer;

the connection electrode is in direct contact with the source electrode in a source opening formed in the lower insulating layer; and when viewed from a normal direction of the main surface of the substrate, the source opening is more distant from the gate electrode than an end portion of the first region of the oxide semiconductor layer, and is located outside the oxide semiconductor layer.

7. The active matrix substrate according to claim 6, wherein the connection electrode includes:

a first contact portion overlapping the first region, the first contact portion being in direct contact with the first region; and a second contact portion overlapping the source opening, the second contact portion being in direct contact with the source electrode.

8. The active matrix substrate according to claim 6, wherein the source opening does not overlap the oxide semiconductor layer.

* * * * *